US012795934B2

(12) United States Patent
Kim

(10) Patent No.: US 12,795,934 B2
(45) Date of Patent: Nov. 10, 2026

(54) MEMORY DEVICE AND METHOD OF MANUFACTURING THE SAME

(71) Applicant: SK hynix Inc., Icheon-si (KR)

(72) Inventor: Ki Deok Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 413 days.

(21) Appl. No.: 18/471,165

(22) Filed: Sep. 20, 2023

(65) Prior Publication Data

US 2024/0334706 A1 Oct. 3, 2024

(30) Foreign Application Priority Data

Apr. 3, 2023 (KR) ........................ 10-2023-0043487

(51) Int. Cl.
*H10B 43/40* (2023.01)
*H10B 41/41* (2023.01)
*G11C 16/08* (2006.01)

(52) U.S. Cl.
CPC ............. *H10B 43/40* (2023.02); *H10B 41/41* (2023.02); *G11C 16/08* (2013.01)

(58) Field of Classification Search
CPC ................................ H10B 43/40; H10B 41/41
USPC .......................................................... 257/314
See application file for complete search history.

(56) References Cited

U.S. PATENT DOCUMENTS

2001/0006243 A1* 7/2001 Morishita ............ H10D 89/601 257/360
2003/0164521 A1* 9/2003 Kojima ................ H10D 89/811 257/355
2003/0205765 A1* 11/2003 Masuoka ............... H10D 84/85 257/369
2003/0207503 A1* 11/2003 Yamazaki .......... H10D 86/0225 257/E21.414
2007/0241407 A1* 10/2007 Kim ..................... H10D 89/811 257/E27.06
2008/0224220 A1* 9/2008 Blanc ................... H10D 89/811 257/E29.062
2015/0287740 A1* 10/2015 Bedell .................. H10D 86/201 438/154

FOREIGN PATENT DOCUMENTS

KR 1020180061333 A 6/2018
KR 102037867 B1 10/2019

* cited by examiner

*Primary Examiner* — Dzung Tran

(74) *Attorney, Agent, or Firm* — WILLIAM PARK AND ASSOCIATES LTD.

(57) ABSTRACT

The present disclosure relates generally to a memory device and a method of manufacturing the same. The memory device includes a well formed in a substrate. The memory device also includes an insulating liner layer formed between the well and the substrate, the insulating liner layer enclosing the well. The memory device further includes first, second, and third junction regions included in the well enclosed by the insulating liner layer, the first, second, and third junction regions being spaced apart from each other. The memory device additionally includes a gate pattern disposed on the well between the first and second junction regions and a blocking layer included in the well, the blocking layer disposed between the second and third junction regions.

17 Claims, 36 Drawing Sheets

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2023-0043487, filed on Apr. 3, 2023, in the Korean Intellectual Property Office, which is incorporated herein by reference in its entirety.

BACKGROUND

1. Technical Field

Various embodiments of the present disclosure relate to a memory device and a method of manufacturing the memory device, and more particularly to a memory device including pass transistors for transferring a high voltage and a method of manufacturing the memory device.

2. Related Art

A memory device may include a memory cell array in which data is stored, a peripheral circuit which performs a program operation, a read operation, or an erase operation, and a control circuit which controls the peripheral circuit.

The memory cell array may include a plurality of memory blocks, each of which may include a plurality of memory cells. A memory device having a three-dimensional (3D) structure may include memory cells stacked on a substrate. For example, the memory device having a 3D structure may include plugs vertical to the substrate. The plugs may include memory cells and select transistors formed between bit lines and a source line. The memory cells and the select transistors between the bit lines and the source line may form strings.

During a program operation on a memory block, a program voltage may be applied to a selected word line among word lines coupled to the memory block. The program voltage may be generated by a voltage generator included in the peripheral circuit, and may be transferred to the selected word line through a row decoder included in the peripheral circuit.

The program voltage may have a level higher than those of normal voltages used to operate the peripheral circuit. Therefore, pass transistors included in the row decoder need to be formed so that a high voltage such as the program voltage can be transferred.

SUMMARY

Various embodiments of the present disclosure are directed to a memory device capable of reducing interference between adjacent pass transistors and a method of manufacturing the memory device.

In accordance with an embodiment of the present disclosure, there is provided a memory device including a well formed in a substrate; an insulating liner layer formed between the well and the substrate, the insulating liner layer enclosing the well; first second, and third junction regions included in the well enclosed by the insulating liner layer, the first, second, and third junction regions being spaced apart from each other; a gate pattern disposed on the well between the first and second junction regions; and a blocking layer included in the well and disposed between the second and third junction regions.

In accordance with an embodiment of the present disclosure, there is provided a memory device including a first well disposed in a first region of a substrate; a second well disposed in a second region of the substrate; a protrusion pattern protruding from a space between a lower surface of the first well and a lower surface of the second well in an upward direction; an insulating liner layer formed between the substrate and the first and second wells and extending along an upper surface of the protrusion pattern; first, second, and third junction regions included in each of the first and second wells, the first, second, and third junction regions spaced apart from each other; a first blocking layer included in each of the first and second wells and disposed between the second and third junction regions; a second blocking layer contacting the insulating liner layer on the protrusion pattern, the second blocking layer separating the first and second wells from each other; and a gate pattern disposed on each of the first and second wells between the first and second junction regions.

In accordance with an embodiment of the present disclosure, there is provided a method of manufacturing a memory device including forming a main trench in a substrate; forming an insulating liner layer along a surface of the substrate exposed through the main trench; forming a well in the main trench in which the insulating liner layer is formed; forming a blocking layer in the well; forming a gate pattern on the well adjacent to the blocking layer; forming first and second junction regions in the well contacting both ends of the gate pattern; and forming a third junction region between a side surface of the well and the blocking layer.

In accordance with an embodiment of the present disclosure, there is provided a method of manufacturing a memory device including forming a main trench in a substrate in which first and second regions adjacent to each other in a horizontal direction are defined; forming a protrusion pattern in which a portion of the substrate protrudes between the first and second regions; forming an insulating liner layer along a surface of the main trench including the protrusion pattern; forming a first well in the first region of the main trench in which the insulating liner layer is formed, and forming a second well in the second region; forming first blocking layers in the first and second wells of the first and second regions; forming a second blocking layer between the first and second wells, the second blocking layer contacting the protrusion pattern and separating the first and second wells from each other; forming a gate pattern on each of the first and second wells; forming first and second junction regions in each of the first and second wells contacting both ends of the gate pattern; and forming a third junction region between the first and second blocking layers.

In accordance with an embodiment of the present disclosure, there is provided a method of manufacturing a memory device including forming a main trench in a substrate; forming an insulating liner layer along a surface of the substrate exposed through the main trench; exposing a portion of the substrate by etching a portion of the insulating liner layer; forming a well in the main trench in which the insulating liner layer is formed; forming a blocking pattern in the substrate contacting the well in a region in which the insulating liner layer is etched; forming a blocking layer in the well; forming a gate pattern on the well adjacent to the blocking layer; forming first and second junction regions in the well contacting both ends of the gate pattern; and forming a third junction region between a side surface of the well and the blocking layer.

DETAILED DESCRIPTION

Specific structural or functional descriptions, disclosed herein, are exemplified to describe embodiments according to the concept of the present disclosure. The embodiments according to the concept of the present disclosure should not be construed as being limited to embodiments described below, and may be modified in various forms and replaced with other equivalent embodiments.

Hereinafter, it will be understood that, although the terms "first" and "second" may be used herein to describe various elements, these elements should not be limited by these terms. The terms are used to distinguish one element from other elements and not to imply a number or order of elements.

Figure 1:
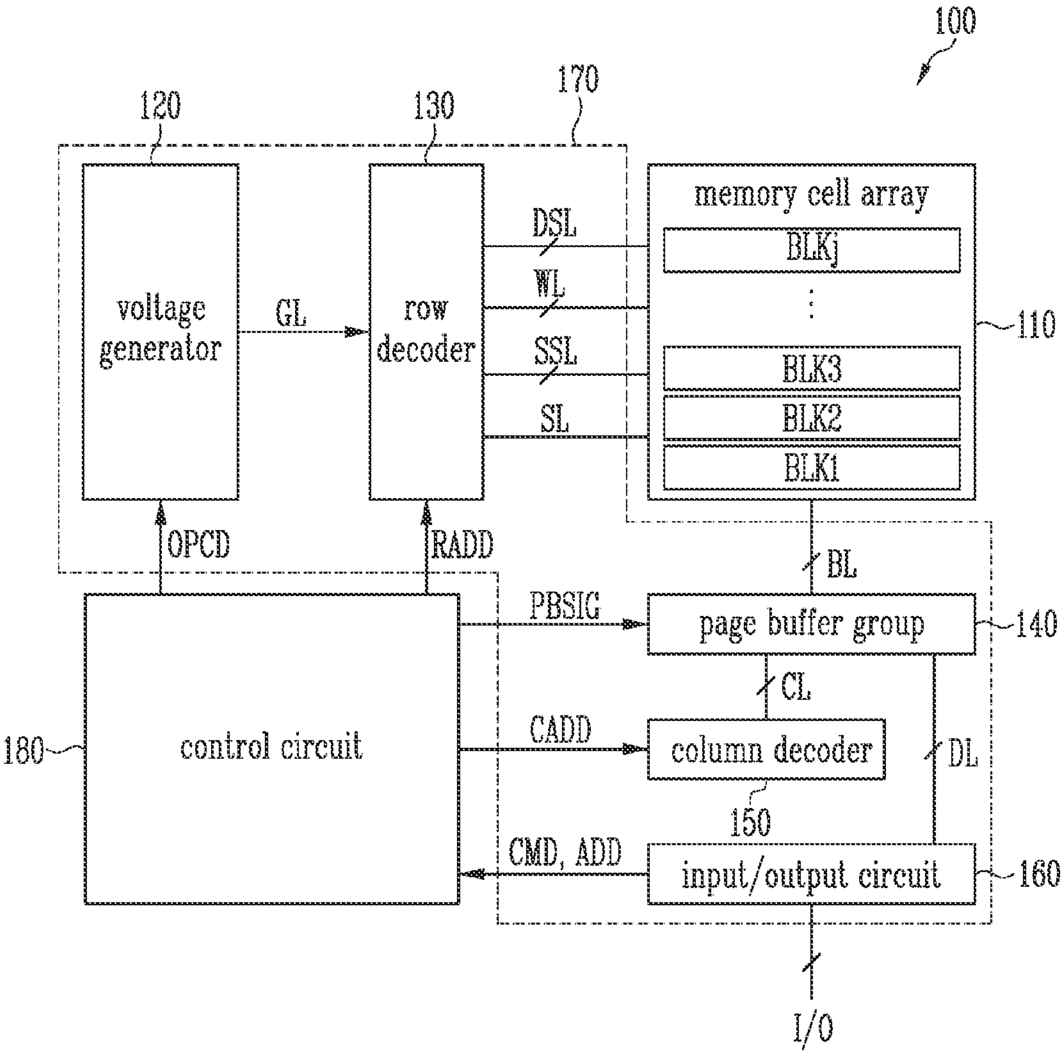
FIG. 1 is a diagram illustrating a memory device.

FIG. 1 is a diagram illustrating a memory device.

Referring to FIG. 1, a memory device 100 may include a memory cell array 110, a peripheral circuit 170, and a control circuit 180.

The memory cell array 110 may include first to j-th memory blocks BLK1 to BLKj. Each of the first to j-th memory blocks BLK1 to BLKj may include a plurality of memory cells in which data can be stored. Drain select lines DSL, word lines WL, source select lines SSL, and a source line SL may be coupled to each of the first to j-th memory blocks BLK1 to BLKj. Bit lines BL may be coupled in common to the first to j-th memory blocks BLK1 to BLKj. The first to j-th memory blocks BLK1 to BLKj may be formed in a three-dimensional (3D) structure. Each of the memory blocks having a 3D structure may include memory cells stacked on a substrate.

According to a program scheme, each memory cell may store 1 bit of data or 2 or more bits of data. For example, a scheme for storing 1 bit of data in one memory cell is referred to as a single-level cell (SLC) scheme, and a scheme for storing 2 bits of data in one memory cell is referred to as a multi-level cell (MLC) scheme. A scheme for storing 3 bits of data in one memory cell is referred to as a triple-level cell (TLC) scheme, and a scheme for storing 4 bits of data in one memory cell is referred to as a quad-level cell (QLC) scheme. In addition, 5 or more bits of data may be stored in one memory cell.

The peripheral circuit 170 may perform a program operation of storing data in the memory cell array 110, a read operation of outputting data stored in the memory cell array 110, and an erase operation of erasing data stored in the memory cell array 110. For example, the peripheral circuit 170 may include a voltage generator 120, a row decoder 130, a page buffer group 140, a column decoder 150, and an input/output circuit 160.

The voltage generator 120 may generate various operating voltages required for a program operation, a read operation, or an erase operation in response to an operation code OPCD. For example, the voltage generator 120 may generate program voltages, turn-on voltages, turn-off voltages, a precharge voltage, negative voltages, verify voltages, read voltages, pass voltages, or erase voltages in response to the operation code OPCD.

The program voltages may be voltages that are applied to a selected word line among the word lines WL during a program operation, and may be used to increase the threshold voltages of memory cells coupled to the selected word line.

The turn-on voltages may be applied to the drain select lines DSL or the source select lines SSL, and may be used to turn on drain select transistors or source select transistors. The turn-off voltages may be applied to the drain select lines DSL or the source select lines SSL, and may be used to turn off the drain select transistors or source select transistors. For example, the turn-off voltage may be set to 0 V.

The negative voltages may be set to voltages lower than 0 V. The precharge voltage may be applied to the source line, and may be used to increase channel voltages of unselected strings during a soft program or normal program operation. The verify voltages may be used for a verify operation of determining whether the threshold voltages of the selected memory cells have increased up to target levels. The verify voltages may be set to various levels depending on the target levels, and may be applied to the selected word line. The read voltages may be applied to the selected word line during a read operation on the selected memory cells. The pass voltages may be voltages that are applied to unselected word lines during a program operation, and may be used to turn on memory cells coupled to the unselected word lines. The erase voltages may be used for an erase operation of erasing the memory cells included in the selected memory block, and may be applied to the source line SL.

The voltage generator 120 may control the levels of operating voltages to be applied to the drain select lines DSL, the word lines WL, the source select lines SSL, and the source line SL, and the times at which the operating voltages are output, in response to the operation code OPCD. The voltage generator 120 may discharge the lines to which the operating voltages are applied, and may control the times during which the lines are discharged. The voltage generator 120 may allow the selected lines to float.

The operating voltages generated by the voltage generator 120 may be transmitted to the row decoder 130 through global lines GL.

The row decoder 130 may transfer the operating voltages to the drain select lines DSL, the word lines WL, the source select lines SSL, and the source line SL, which are coupled to a memory block selected according to a row address RADD. For example, the row decoder 130 may be coupled to the voltage generator 120 through global lines GL, and may be coupled to the first to j-th memory blocks BLK1 to BLKj through local lines LL including the drain select lines DSL, the word lines WL, the source select lines SSL, and the source line SL.

The page buffer group 140 may include page buffers (not illustrated) coupled to the first to j-th memory blocks BLK1 to BLKj through the bit lines BL. During a program operation, program data transferred from the input/output circuit 160 may be stored in the page buffer group 140. The page buffer group 140 may apply a program-enable voltage or a program-inhibit voltage to the bit lines BL based on the program data in response to page buffer control signals PBSIG. During a verify operation, the page buffer group 140 may sense the currents or voltages of the bit lines BL varying with the threshold voltages of the selected memory cells, and may store sensed data.

The column decoder 150 may be configured such that data is transferred between the page buffer group 140 and the input/output circuit 160 in response to a column address CADD. For example, the column decoder 150 may be coupled to the page buffer group 140 through column lines CL, and may transmit enable signals through the column lines CL. The page buffers (not illustrated) included in the page buffer group 140 may receive or output data through data lines DL in response to the enable signals.

The input/output circuit 160 may receive or output a command CMD, an address ADD, or data through input/output lines I/O. For example, the input/output circuit 160 may transmit the command CMD and the address ADD, received from an external controller through the input/output lines I/O, to the control circuit 180, and may transmit the data, received from the external controller through the input/output lines I/O, to the page buffer group 140. Alternatively, the input/output circuit 160 may output data, received from the page buffer group 140, to the external controller through the input/output lines I/O.

The control circuit 180 may output the operation code OPCD, the row address RADD, the page buffer control signals PBSIG, and the column address CADD in response to the command CMD and the address ADD. For example, when the command CMD input to the control circuit 180 is a command corresponding to a program operation, the control circuit 180 may control the peripheral circuit 170 so that a program operation is performed on a memory block selected by the address ADD. When the command CMD input to the control circuit 180 is a command corresponding to a read operation, the control circuit 180 may control the peripheral circuit 170 so that a read operation is performed on a memory block selected by the address and read data is output. When the command CMD input to the control circuit 180 is a command corresponding to an erase operation, the control circuit 180 may control the peripheral circuit 170 so that an erase operation is performed on a selected memory block.

Figure 2:
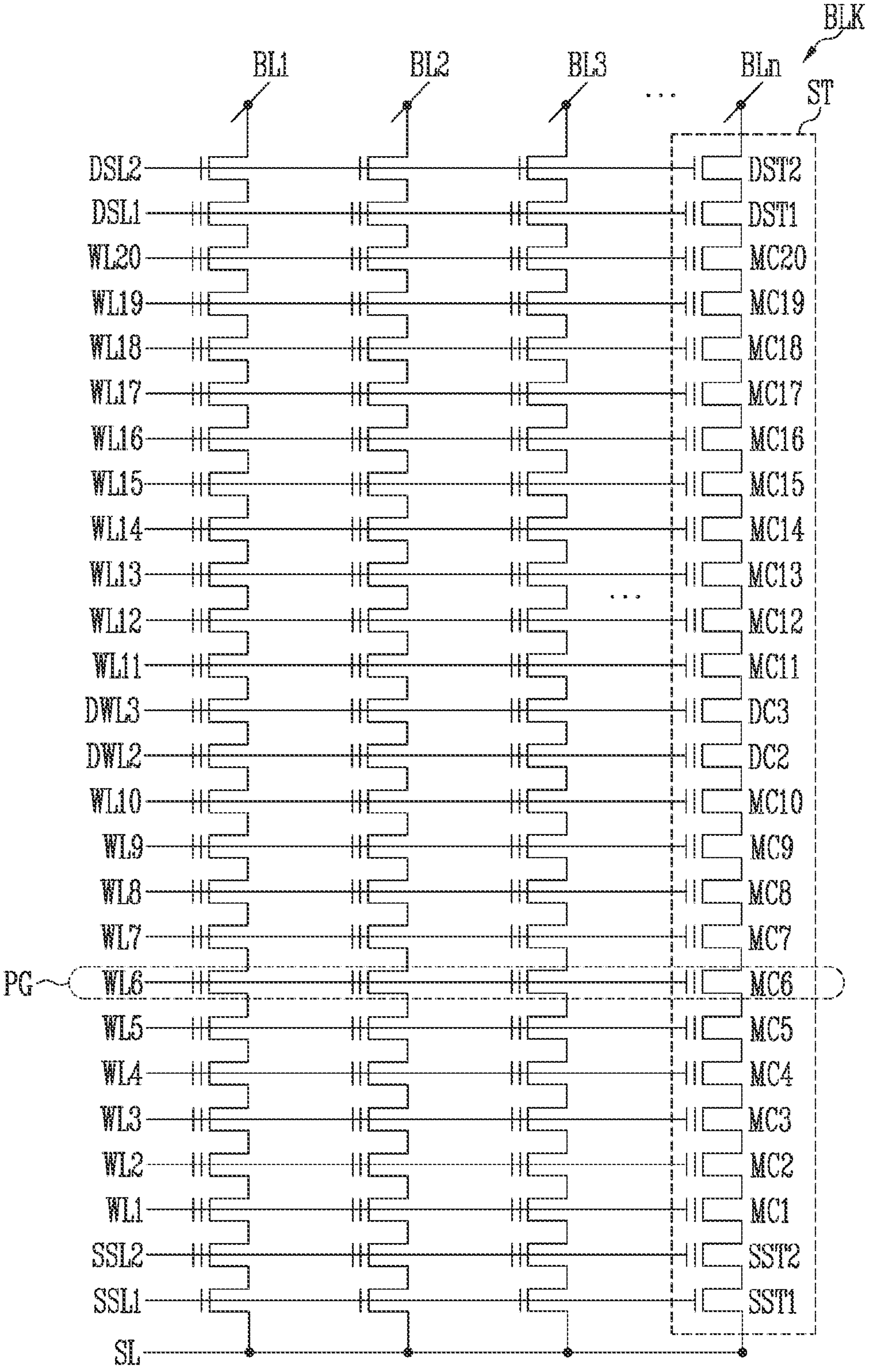
FIG. 2 is a circuit diagram illustrating a memory block.

FIG. 2 is a circuit diagram illustrating a memory block.

Referring to FIG. 2, a memory block BLK may be any one of the first to j-th memory blocks BLK1 to BLKj illustrated in FIG. 1. The memory block BLK may include strings ST coupled between first to n-th bit lines BL1 to BLn and a source line SL. For example, the strings ST may be coupled in common to the source line SL and may be coupled to the first to n-th bit lines BL1 to BLn, respectively. The structure of the string ST coupled between the n-th bit line BLn and the source line SL will be described by way of example.

The string ST may include a source select transistor, memory cells, and a drain select transistor which are coupled in series to each other between the source line SL and the n-th bit line BLn. For example, the string ST may include first and second source select transistors SST1 and SST2, first to twentieth memory cells MC1 to MC20, and first and second drain select transistors DST1 and DST2. Because the string ST illustrated in FIG. 2 is illustrated as an example for explaining the connection component of the memory block BLK, the numbers of source select transistors, memory cells, and drain select transistors that are included in the string ST may be changed depending on the memory device, and dummy cells may be included in the string.

The first and second source select transistors SST1 and SST2 may electrically connect or disconnect the source line SL and the first memory cell MC1 to or from each other. Gates of the first source select transistors SST1 included in different strings ST may be coupled to the first source select line SSL1, and gates of the second source select transistors SST2 may be coupled to the second source select line SSL2. During a program operation, a precharge voltage or a ground voltage may be applied to the source line SL, and a turn-on voltage or a turn-off voltage may be applied to the first and second source select lines SSL1 and SSL2.

The first to twentieth memory cells MC1 to MC20 may store data. Gates of the first to twentieth memory cells MC1 to MC20 included in different strings ST may be coupled to first to twentieth word lines WL1 to WL20, respectively. For example, the gates of the first memory cells MC1 included in different strings ST may be coupled to the first word line WL1, and the gates of the second memory cells MC2 included in different strings ST may be coupled to the second word line WL2. In this way, the third to twentieth memory cells MC3 to MC20 may be coupled to the third to twentieth word lines WL3 to WL20, respectively. A group of memory cells coupled to the same word line may form a page (PG), and a program operation or a read operation may be performed on a page basis.

The first and second drain select transistors DST1 and DST2 may be configured to electrically connect or disconnect the first to n-th bit lines BL1 to BLn to or from the twentieth memory cells MC20. The gates of the first drain select transistors DST1 included in different strings ST may be coupled to the first drain select line DSL1, and the gates of the second drain select transistors DST2 may be coupled to the second drain select line DSL2. During a program operation, the turn-on voltage or the turn-off voltage may be applied to the first and second drain select lines DSL1 and DSL2.

During the program operation, the program-enable voltage or the program-inhibit voltage may be applied to the first to n-th bit lines BL1 to BLn. For example, the program-enable voltage may be set to 0 V, and the program-inhibit voltage may be set to a supply voltage.

Figure 3:
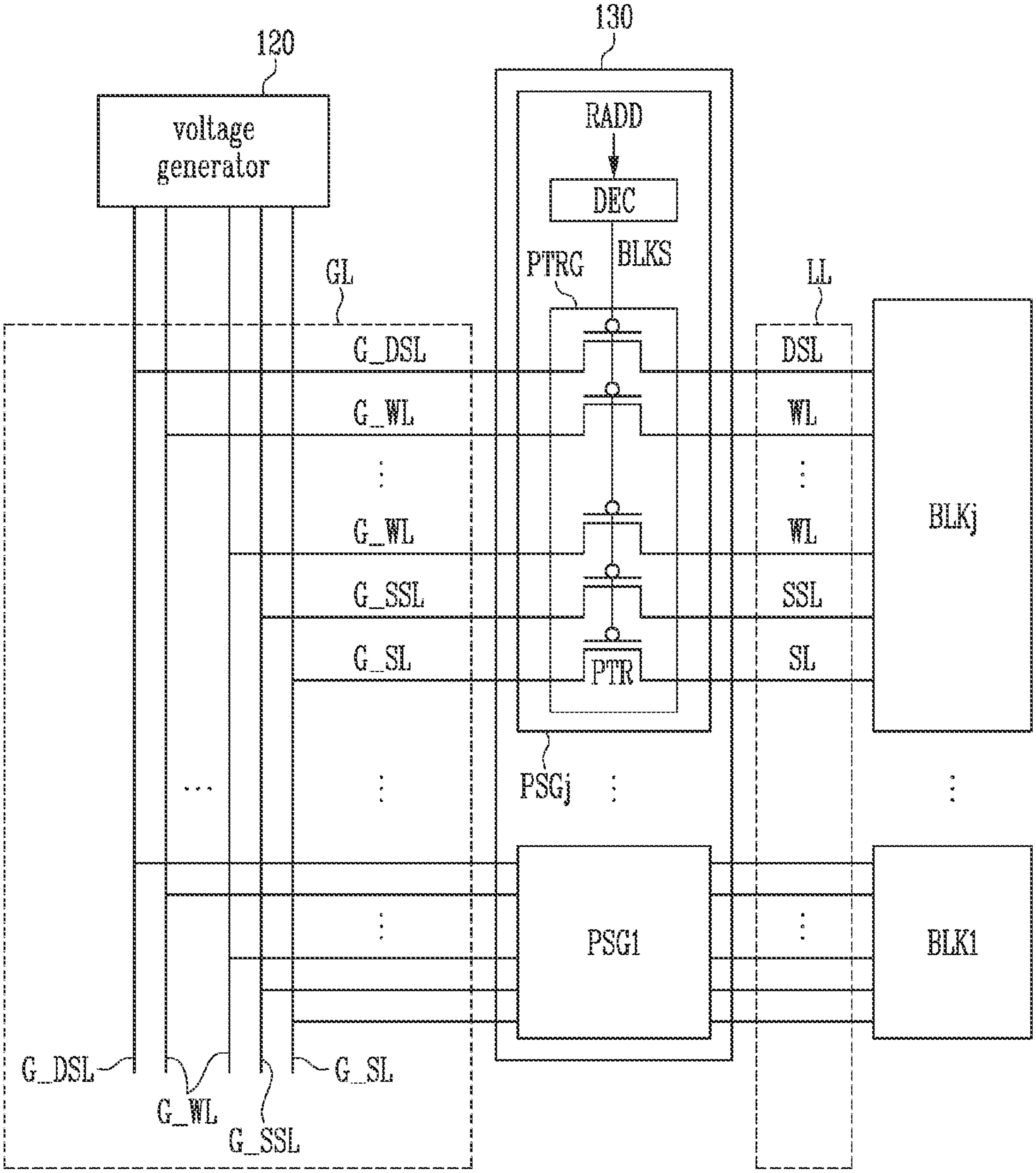
FIG. 3 is a circuit diagram illustrating a row decoder.

FIG. 3 is a circuit diagram illustrating a row decoder.

Referring to FIG. 3, the row decoder 130 may include first to j-th pass switching groups PSG1 to PSGj respectively coupled to first to j-th memory blocks BLK1 to BLKj. Although, in FIG. 3, for convenience of description, the j-th pass switching group PSGj is illustrated in detail, description of the j-th pass switching group PSGj may also be applied to the remaining first to j−1-th pass switching groups PSG1 to PSG(j−1).

The j-th pass switching group PSGj may include a decoder DEC and a pass transistor group PTRG.

The decoder DEC may apply a block control signal to a block select line BLKS in response to a row address RADD. The pass transistor group PTRG may include pass transistors PTR coupled between global lines GL and local lines LL.

The global lines GL may include a global drain select line G_DSL, global word lines G_WL, a global source select line G_SSL, and a global source line G_SL.

The decoder DEC may turn on or off the pass transistors PTR by applying the block control signal to the block select line BLKS in response to the row address RADD. For example, when the decoder DEC activates the j-th pass switching group PSGj in response to the row address RADD, the decoder DEC may apply a block control signal having a 0 V or a negative voltage to the block select line BLKS. Activation of the j-th pass switching group PSGj may mean that the pass transistors PTR included in the pass transistor group PTRG of the j-th pass switching group PSGj are turned on. When the j-th pass switching group PSGj is activated, the j-th memory block BLKj coupled to the j-th pass switching group PSGj may be selected. When the decoder DEC deactivates the j-th pass switching group PSGj in response to the row address RADD, the decoder DEC may apply a block control signal having a positive voltage. Deactivation of the j-th pass switching group PSGj may mean that the pass transistors PTR included in the pass transistor group PTRG of the j-th pass switching group PSGj are turned off. When the j-th pass switching group PSGj is deactivated, the j-th memory block BLKj coupled to the j-th pass switching group PSGj may be unselected.

The plurality of pass transistors PTR included in the pass transistor group PTRG may be implemented as PMOS transistors. The plurality of pass transistors PTR may be coupled to the voltage generator 120 through the global lines GL, and may be coupled to the j-th memory block BLKj through the local lines LL.

The row decoder 130 may electrically connect a memory block, selected by the row address RADD among first to j-th memory blocks BLK1 to BLKj, to the global lines GL. Further, the row decoder 130 might not electrically connect memory blocks, which is not selected by the row address RADD among the first to j-th memory blocks BLK1 to BLKj, to the global lines GL. For example, the local lines LL coupled to the selected memory block may be electrically connected to the global lines GL and the local lines LL coupled to the unselected memory blocks might not be electrically connected to the global lines GL.

When the pass transistors PTR of the j-th pass switching group PSGj are turned on, the global drain select line G_DSL and a drain select line DSL, the global word lines G_WL and word lines WL, the global source select line G_SSL and a source select line SSL, and the global source line G_SL and a source line SL may be electrically connected to each other through respective pass transistors PTR. When the pass transistors PTR are turned on, operating voltages generated by the voltage generator 120 may transmitted to the j-th memory block BLKj through the global lines GL, the pass transistors PTR, and the local lines LL.

When the pass transistors PTR of the j-th pass switching group PSGj are turned off, the global drain select line G_DSL and a drain select line DSL, the global word lines G_WL and word lines WL, the global source select line G_SSL and a source select line SSL, and the global source line G_SL and a source line SL may be electrically disconnected from each other through respective pass transistors PTR. When the pass transistors PTR are turned off, the operating voltages that are generated by the voltage generator 120 and are applied to the global lines GL might not be transmitted to the j-th memory block BLKj.

Figure 4:
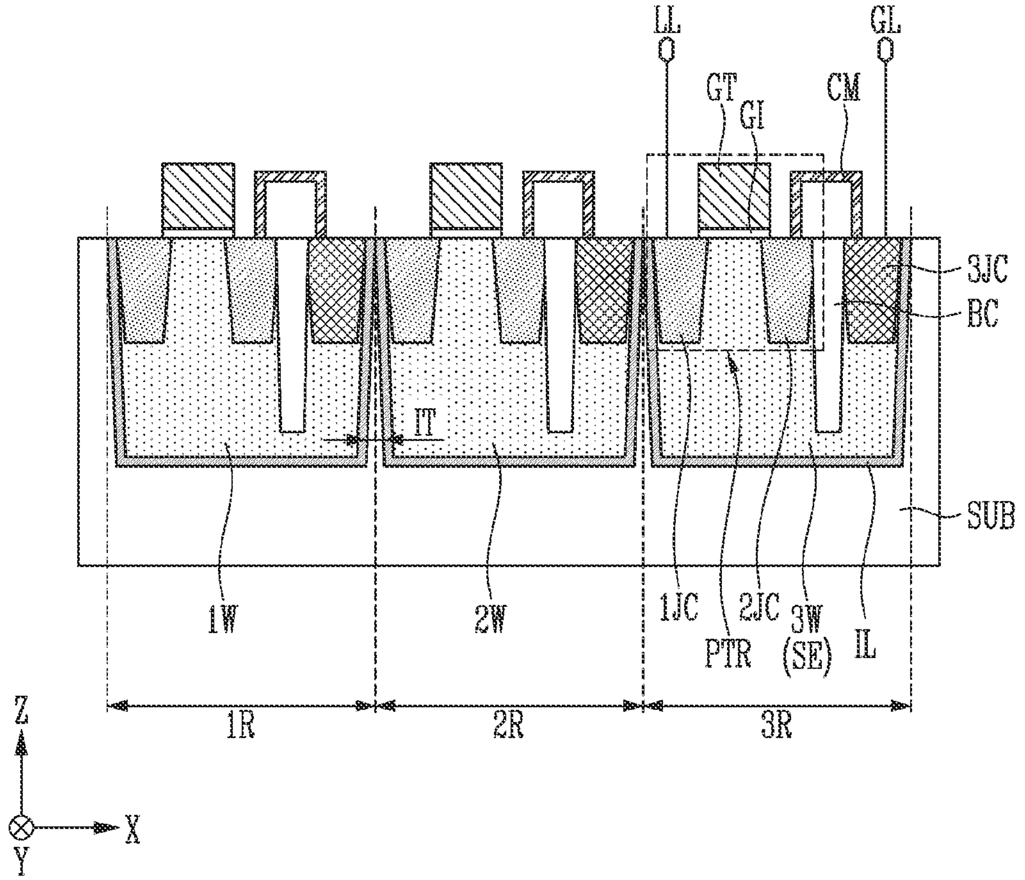
FIG. 4 is a view illustrating the structure of a memory device according to a first embodiment of the present disclosure.

FIG. 4 is a view illustrating the structure of a memory device according to a first embodiment of the present disclosure.

Referring to FIG. 4, some pass transistors PTR included in a pass transistor group (e.g., PTRG of FIG. 3) are illustrated. In FIG. 4 three pass transistors PTR among a plurality of pass transistors PTR are illustrated by way of example.

Different pass transistors PTR may be formed in first to third well regions 1R to 3R adjacent to each other in a substrate SUB. The pass transistors PTR may be implemented as PMOS transistors. For example, when the substrate SUB is a P-type substrate, N-type first to third wells 1W to 3W may be disposed in the first to third well regions 1R to 3R. Each of the first to third wells 1W to 3W may be formed of a semiconductor layer SE. For example, the semiconductor layer SE may be formed of a polysilicon layer implanted with N-type impurities. The upper surfaces of the first to third wells 1W to 3W and the substrate SUB may extend in the same plane.

The side and lower surfaces of the first to third walls 1W to 3W may be enclosed by an insulating liner layer IL. The insulating liner layer IL may be formed of insulating layers to electrically isolate the first to third wells 1W to 3W from the substrate SUB and electrically isolate the first to third wells 1W to 3W from each other. For example, the insulating liner layer IL may be formed of an oxide layer or a nitride layer.

Each of the first to third wells 1W to 3W may include first to third junction regions 1JC to 3JC, which are spaced apart from each other, and a blocking layer BC, which is disposed between the second and third junction regions 2JC and 3JC. The first and second junction regions 1JC and 2JC may be a source or a drain included in the corresponding pass transistor PTR, and the third junction region 3JC may be a well-pickup. For example, the first and second junction regions 1JC and 2JC may be formed by implanting P-type impurities into the well, and the third junction region 3JC may be formed by implanting N-type impurities into the well. The concentration of impurities implanted into the third junction region 3JC may be higher than that of impurities implanted into each of the first to third wells 1W to 3W.

A gate insulating layer GI and a gate conductive layer GT may be disposed on the well between the first and second junction regions 1JC and 2JC. The gate insulating layer GI may be formed of an oxide layer, and the gate conductive layer GT may be made of a metal material such as tungsten (W), molybdenum (Mo), cobalt (Co), or nickel (Ni), or a semiconductor material such as silicon (Si) or polysilicon (Poly-Si). The gate insulating layer GI and the gate conductive layer GT may be the gate pattern of the corresponding pass transistor PTR. Therefore, the pass transistor PTR including the first and second junction regions 1JC and 2JC, the gate insulating layer GI, and the gate conductive layer GT may be implemented.

The second and third junction regions 2JC and 3JC may be electrically connected to each other through a connection line CM. For example, the connection line CM may be formed of a conductive layer disposed on the second and third junction regions 2JC and 3JC. The blocking layer BC may be formed of an insulating layer so as electrically isolate the second and third junction regions 2JC and 3JC from each other inside the corresponding well. For example, the blocking layer BC may be formed of an oxide layer.

Assuming that a local line LL is coupled to the first junction region 1JC of the pass transistor PTR and a global line GL is coupled to the third junction region 3JC, the blocking layer BC may electrically isolate the second and third junction regions 2JC and 3JC formed in the same well from each other, and the insulating liner layer IL may electrically isolate different wells from each other. Therefore, even though a high voltage such as a program voltage is applied to the global line GL, a leakage or bridge that may occur between adjacent wells may be reduced, with the result that a breakdown voltage may be increased.

FIGS. 5A to 5I are views illustrating a method of manufacturing a memory device according to a first embodiment of the present disclosure.

Figure 5A:
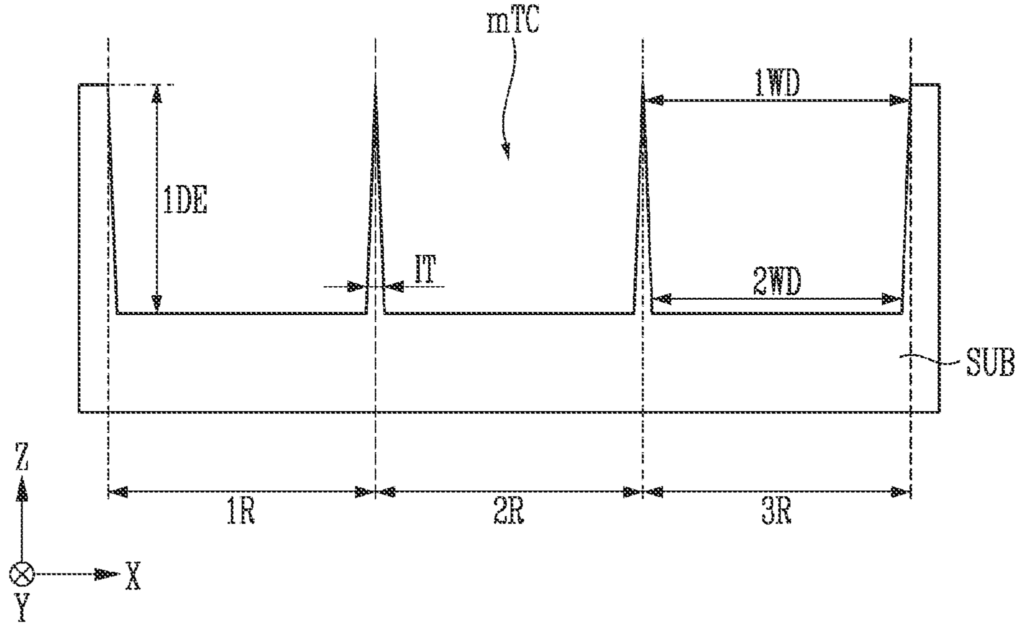
FIGS. 5A to 5I are views illustrating a method of manufacturing a memory device according to a first embodiment of the present disclosure.

Referring to FIG. 5A, main trenches mTC having a first depth 1DE may be formed in a substrate SUB. For example, on the substrate SUB in which first to third regions 1R to 3R are defined, a mask pattern (not illustrated) for exposing each of the first to third regions 1R to 3R may be formed, and the main trenches mTC may be formed by etching the substrate SUB exposed through openings of the mask pattern. The first to third regions 1R to 3R may be defined along an X direction, and the depth of the main trenches mTC may be defined as the depth in a Z direction vertical to the X direction.

As an etching process for forming the main trenches mTC, an anisotropic dry etching process may be performed. Due to the physical characteristics of the anisotropic dry etching process, the lower width of the main trench mTC formed in each of the first to third regions 1R to 3R may be less than the upper width thereof. For example, assuming that the upper width of the main trench mTC is a first width 1WD, the lower width of the main trench mTC may be a second width 2WD less than the first width 1WD. Therefore, a margin of a first interval 1T may occur between lower portions of adjacent main trenches mTC.

Figure 5B:
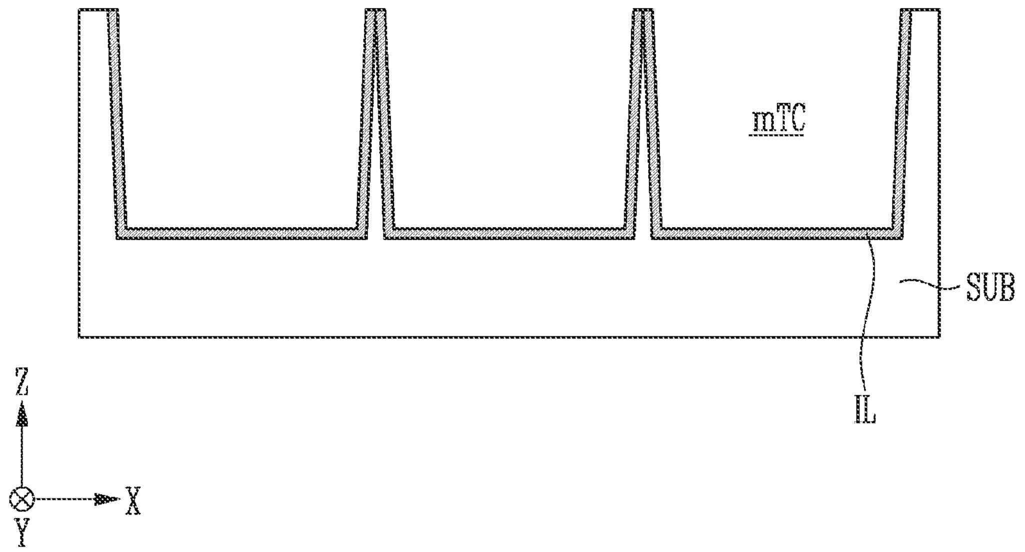

Referring to FIG. 5B, an insulating liner layer IL may be formed along the surface of the substrate SUB exposed through the main trenches mTC. The insulating liner layer IL may be formed of an insulating layer such as an oxide layer or a nitride layer. The insulating liner layer IL may be formed through an oxidization process of oxidizing the substrate SUB exposed through the main trenches mTC.

Figure 5C:
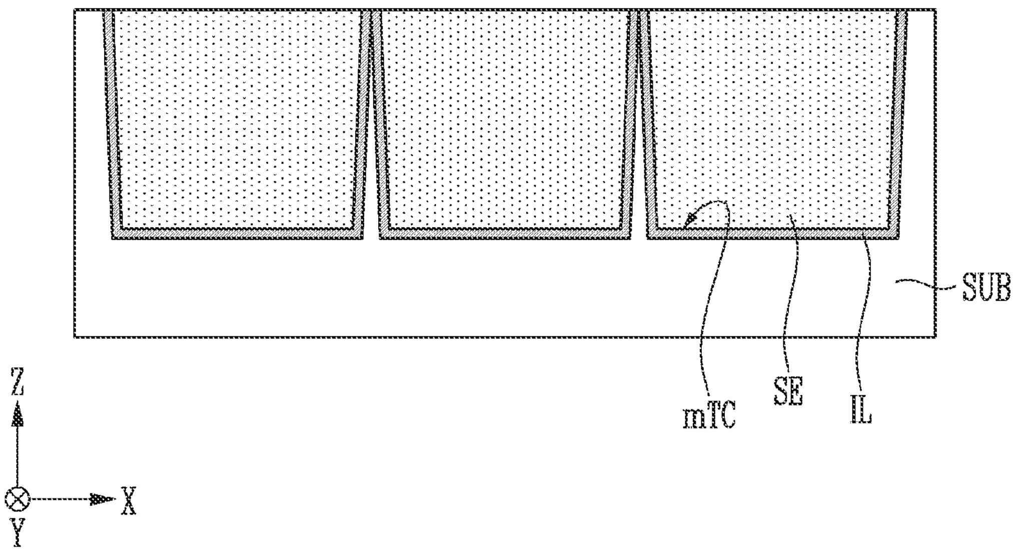

Referring to FIG. 5C, a semiconductor layer SE may be formed in each of the main trenches mTC in which the insulating liner layer IL is formed. The semiconductor layer SE may be a polysilicon layer, and may be formed through atomic layer deposition (ALD), chemical vapor deposition (CVD), or physical vapor deposition (PVD). The semiconductor layer SE may include N-type impurities. For example, N-type impurities and the polysilicon layer may be simultaneously formed in the main trenches mTC. Alternatively, after the polysilicon layer is formed, an ion implantation process of implanting N-type impurities into the polysilicon layer may be further performed. Because the semiconductor layer SE may also be formed on the substrate SUB in addition to the main trenches mTC, a planarization process may be performed until the substrate SUB is exposed after each of the main trenches mTC is filled with the semiconductor layer SE.

Figure 5D:
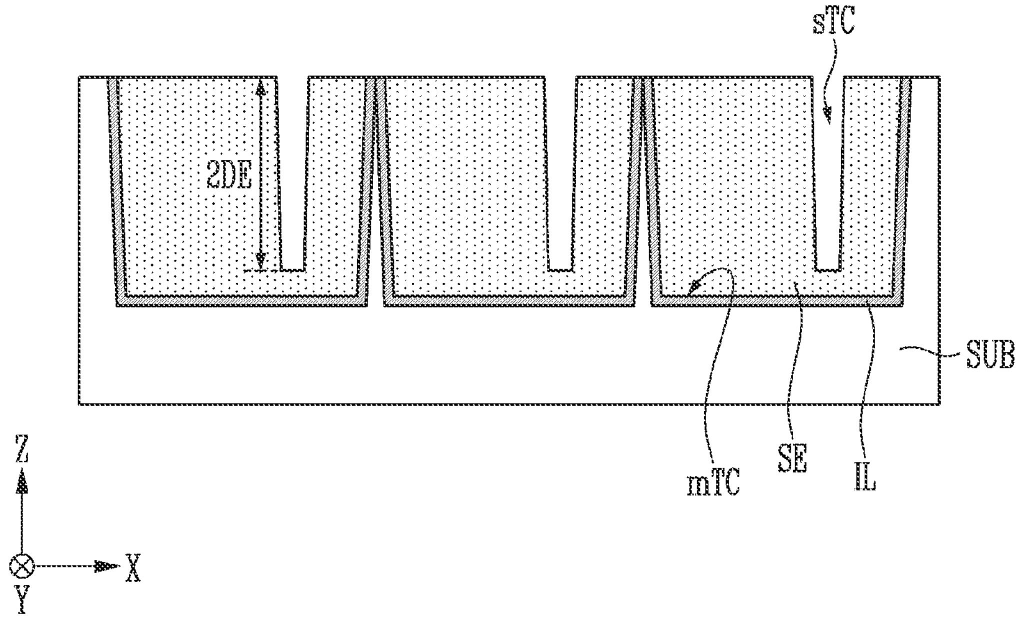

Referring to FIG. 5D, sub-trenches sTC may be formed in the semiconductor layer SE. The sub-trenches sTC may be formed by etching portions of semiconductor layers SE formed in the main trenches mTC, respectively. An etching process of forming the sub-trenches sTC may be stopped at a depth short of the insulating liner layer IL so the insulating liner layer IL is not exposed. For example, the sub-trenches sTC may have a second depth 2DE less than the first depth (e.g., 1DE of FIG. 5A). The second depth 2DE may be a depth that is greater than the depths of the second and third junction regions (e.g., 2JC and 3JC of FIG. 4) and at which the insulating liner layer IL is not exposed.

Figure 5E:
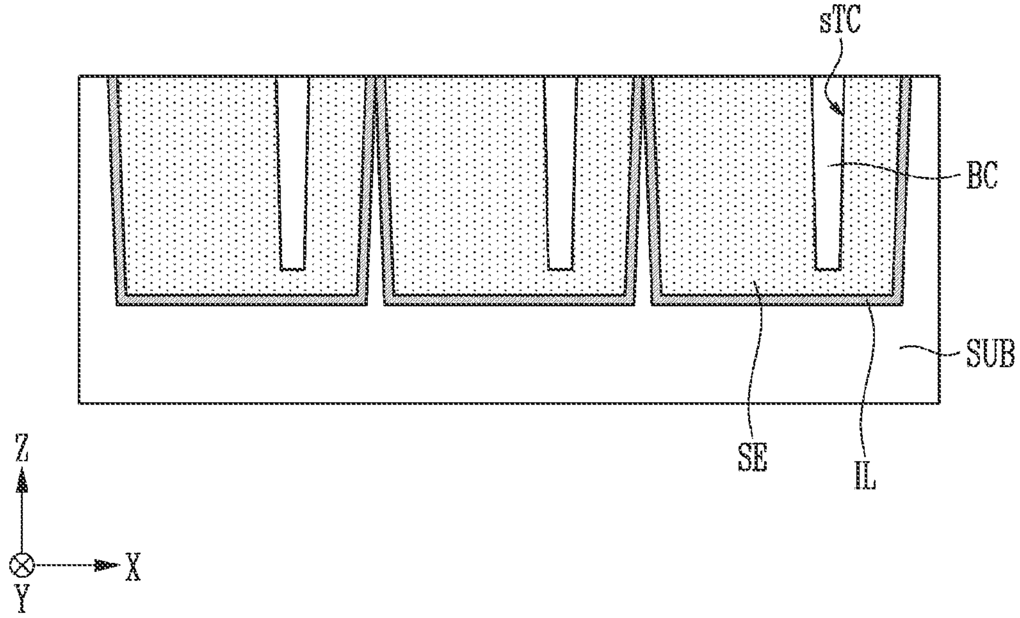

Referring to FIG. 5E, each of the sub-trenches sTC may be filled with a blocking layer BC. The blocking layer BC may be formed of an insulating layer such as an oxide layer. For example, the blocking layer BC may be formed on the entire structure to fill the sub-trenches sTC, and a planarization process may be performed until the semiconductor layers SE are exposed. As a result, the blocking layer BC may individually remain in different sub-trenches sTC.

Figure 5F:
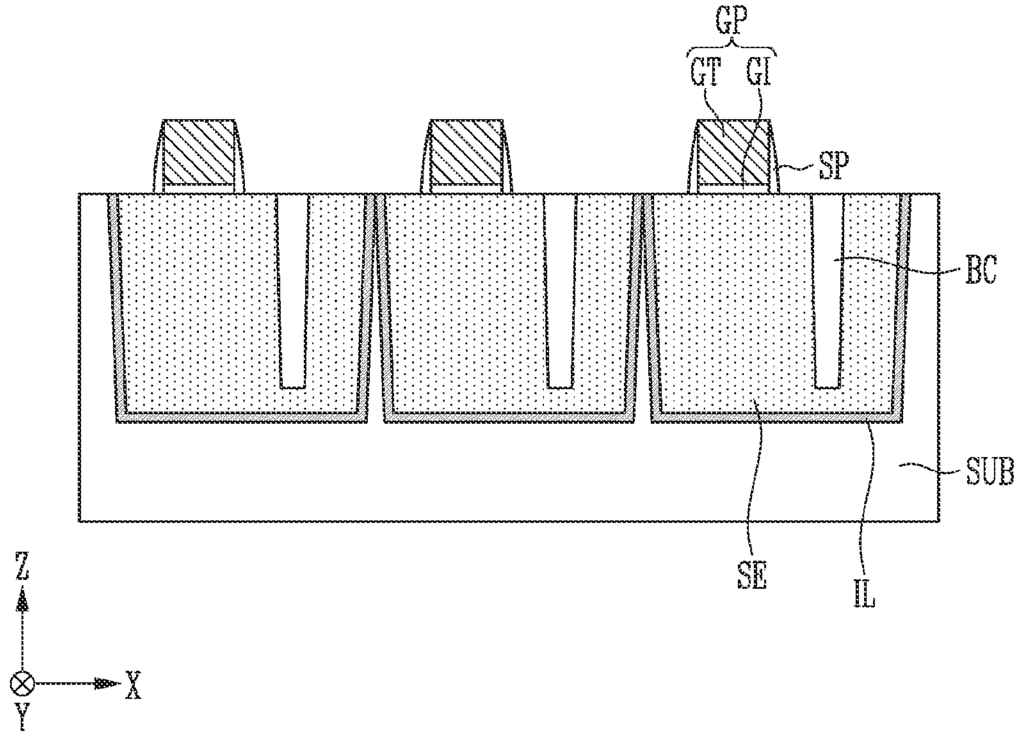

Referring to FIG. 5F, gate patterns GP may be formed on the semiconductor layers SE. Each of the gate patterns GP may include a gate insulating layer GI formed on the corresponding semiconductor layer SE and a gate conductive layer GT formed on the gate insulating layer GI. For example, an insulating layer for the gate insulating layers GI may be formed on the blocking layers BC, the semiconductor layers SE, the insulating liner layer IL, and the substrate SUB, and a conductive layer for the gate conductive layers GT may be formed on the insulating layer. Subsequently, the gate conductive layers GT and the gate insulating layers GI having linear shapes may be formed by patterning the conductive layer and the insulating layer. The gate patterns GP may form the block select line BLKS illustrated in FIG. 3. Therefore, although the gate patterns GP are illustrated as being separated from each other in the cross-section illustrated in FIG. 5F, the gate patterns GP may contact each other in other regions. After the gate patterns GP are formed, spacers SP may be further formed on the side surfaces of the gate patterns GP. The spacers SP may be formed of an insulating layer such as an oxide layer.

Figure 5G:
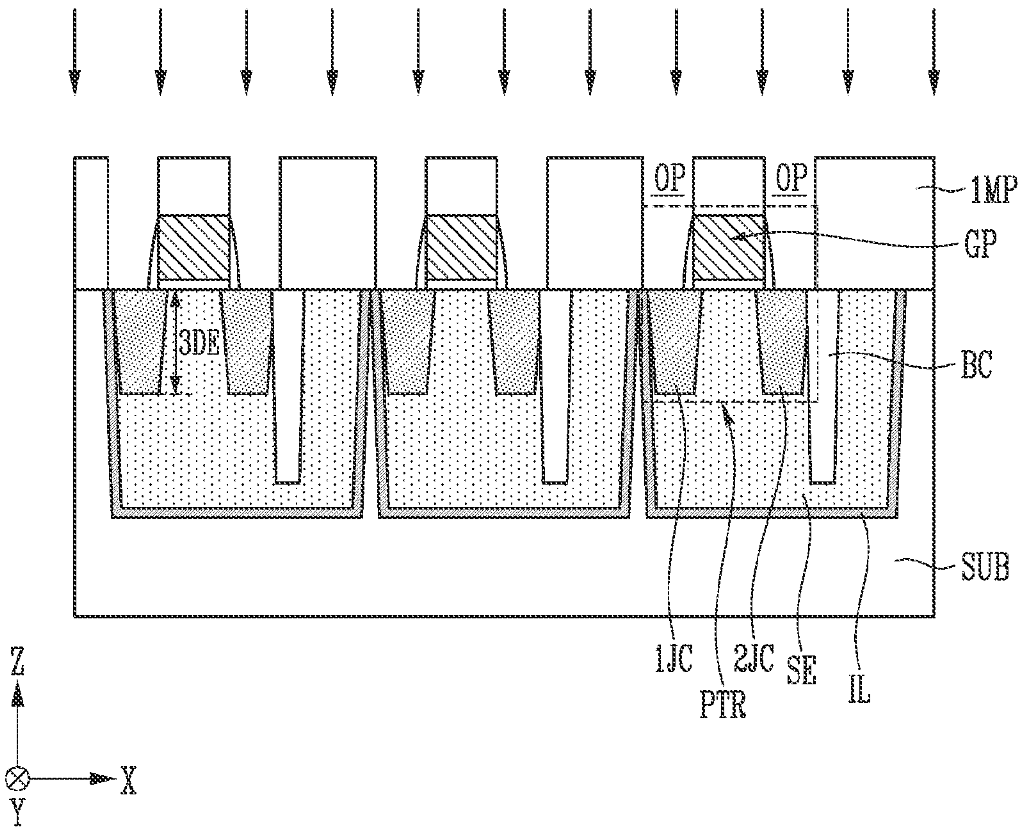

Referring to FIG. 5G, first and second junction regions 1JC and 2JC may be formed in the semiconductor layer SE contacting both ends of each of the gate patterns GP. For example, a first mask pattern 1MP for exposing the semiconductor layer SE contacting both ends of each of the gate patterns GP may be formed, and an ion implantation process of implanting P-type impurities into the semiconductor layer SE exposed through openings OP of the first mask pattern 1MP may be performed. The first and second junction regions 1JC and 2JC may be formed to have depths less than that of the blocking layer BC. The first and second junction regions 1JC and 2JC may be formed, and thus pass transistors PTR including first and second junction regions 1JC and 2JC and the gate patterns GP may be formed. The first and second junction regions 1JC and 2JC may have a third depth 3DE less than the second depth (2DE of FIG. 5D).

Figure 5H:
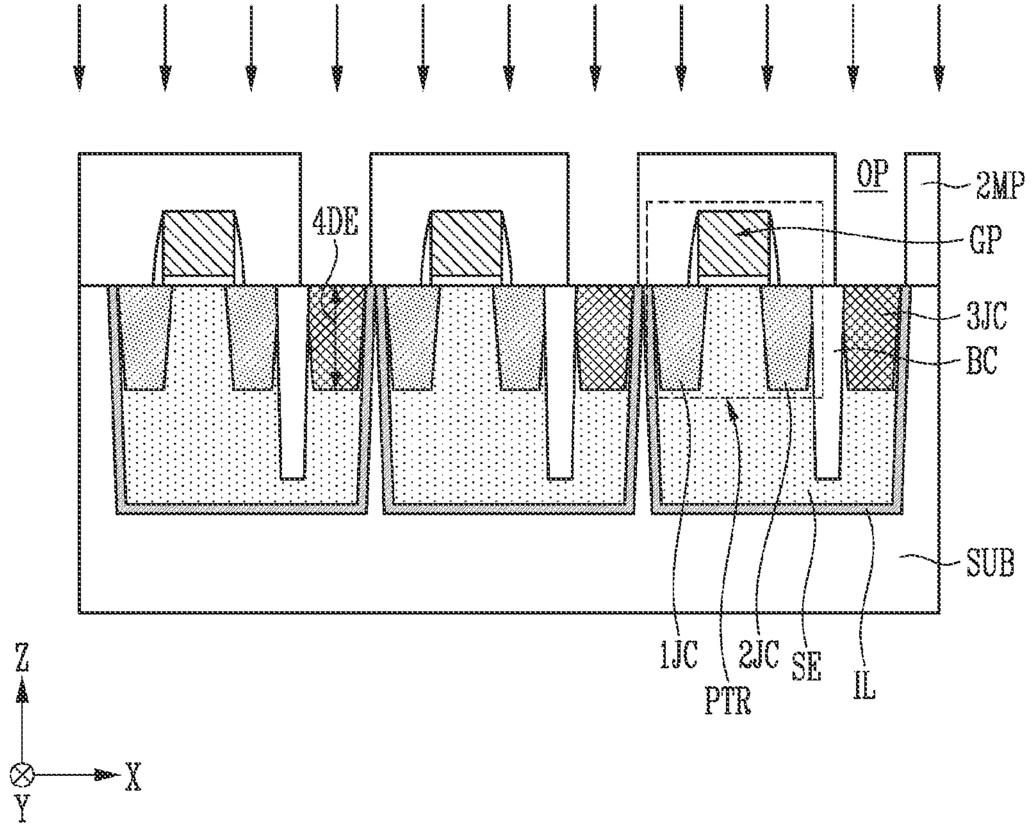

Referring to FIG. 5H, the first mask pattern (e.g., 1MP of FIG. 5G) may be removed, and a second mask pattern 2MP in which openings OP are formed may be formed in a well-pickup region. For example, the second mask pattern 2MP may include openings for exposing the semiconductor layers SE between the blocking layers BC and the insulating liner layer IL. An ion implantation process of implanting N-type impurities into the semiconductor layers SE exposed through the openings of the second mask pattern 2MP may be performed. Each semiconductor layer SE implanted with N-type impurities may be a third junction region 3JC, and the third junction region 3JC may form a well-pickup. The well-pickup may be a region contacting the global line. The third junction region 3JC may have a fourth depth 4DE. The fourth depth 4DE may be identical to the third depth (e.g., 3DE of FIG. 5G), but it may be different from the third depth 3DE depending on a manufacturing process.

Figure 5I:
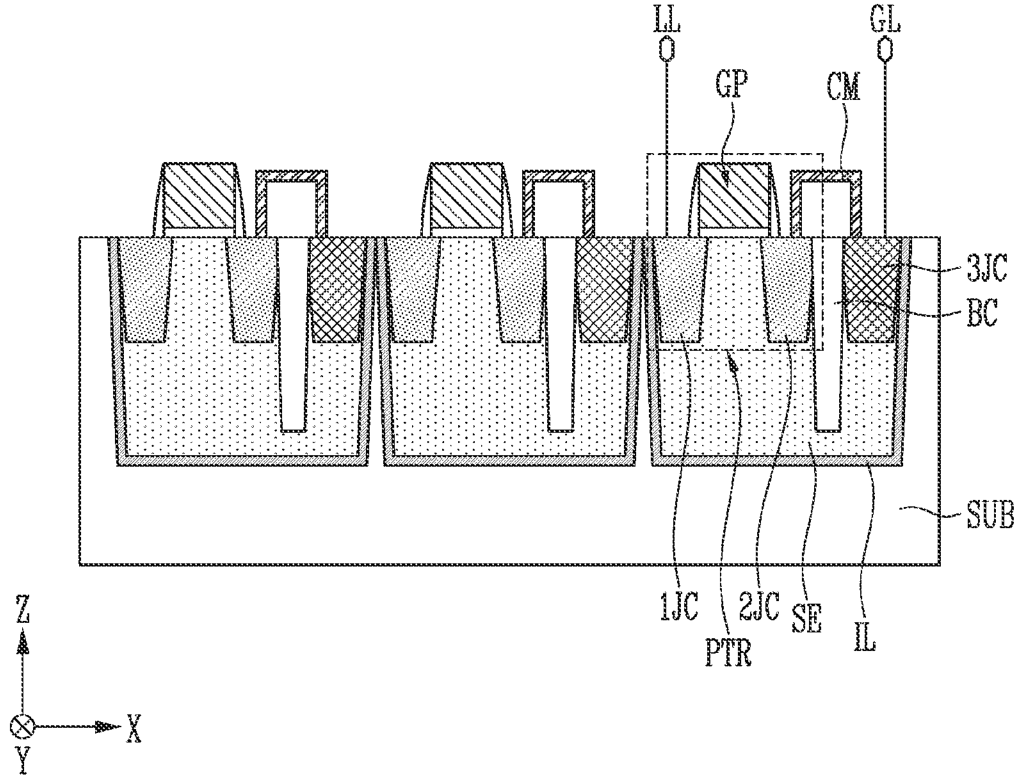

Referring to FIG. 5I, the second mask pattern (e.g., 2MP of FIG. 5H) is removed, and connection lines CM for electrically connecting the second and third junction regions 2JC and 3JC to each other may be formed. The local line LL may be coupled to the first junction region 1JC, and the global line GL may be coupled to the third junction region 3JC. Although the local line LL and the global line GL are illustrated as being coupled to the third region 3R in the drawing, various local lines LL and various global lines GL may also be coupled to the first and second regions 1R and 2R.

Figure 6:
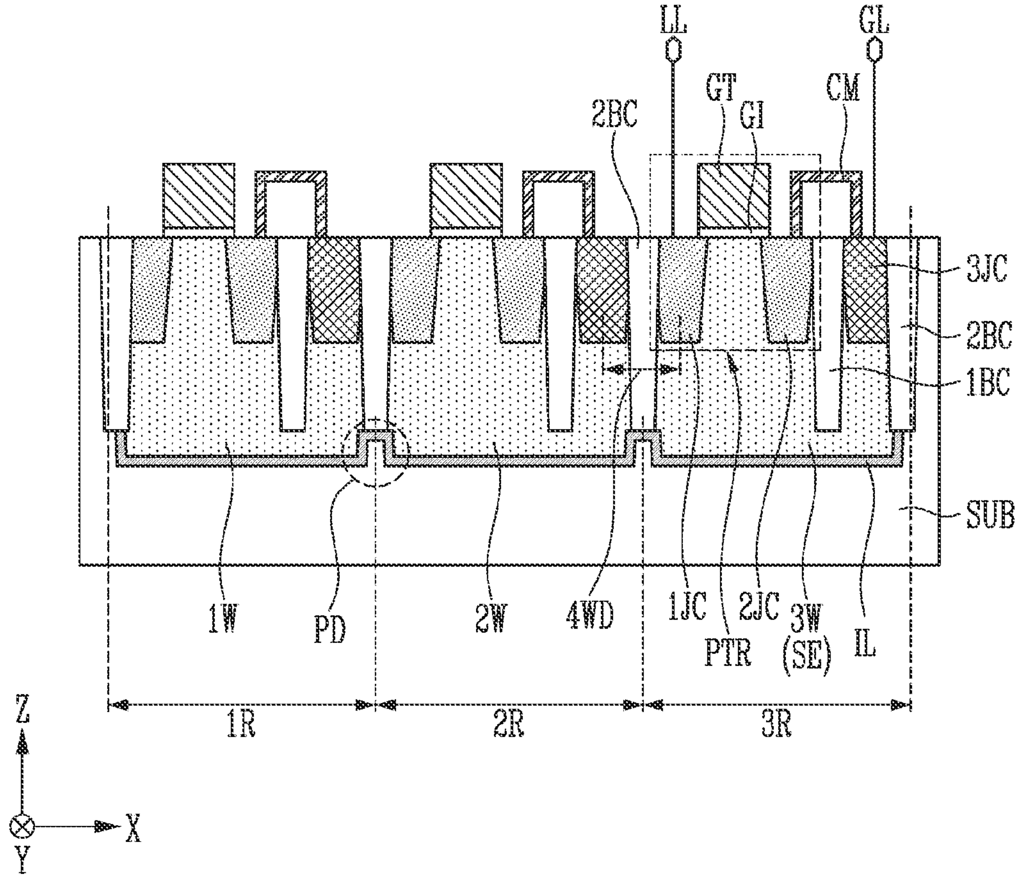
FIG. 6 is a view illustrating the structure of a memory device according to a second embodiment of the present disclosure.

FIG. 6 is a view illustrating the structure of a memory device according to a second embodiment of the present disclosure.

Referring to FIG. 6, the memory device according to the second embodiment of the present disclosure may further include second blocking layers 2BC and protrusion patterns PD formed between first to third regions 1R to 3R, compared to the memory device according to the first embodiment. For example, in the second embodiment, the blocking layers (e.g., BC of FIG. 4) in the first embodiment may be first blocking layers 1BC, and the second blocking layers 2BC may be further formed between the first to third regions 1R to 3R. The second blocking layers 2BC may be formed of the same layer as the first blocking layers 1BC.

First to third wells 1W to 3W may be formed in the first to third regions 1R to 3R, and the protrusion patterns PD in which portions of the substrate SUB protrude in an upward direction Z may be further formed in lower portions of adjacent parts of the first to third wells 1W to 3W. An insulating liner layer IL may be formed along the upper surfaces of the protrusion patterns PD. The insulating liner layer IL may extend along the lower surfaces of the first to third wells 1W to 3W and the upper surfaces of the protrusion patterns PD. Therefore, the insulating liner layer IL may be formed between the second blocking layers 2BC and the protrusion patterns PD. Because the remaining components other than the protrusion patterns PD and the second blocking layers 2BC are identical to those of the first embodiment described above with reference to FIG. 4, descriptions of the components identical to those of the first embodiment will be omitted.

In the memory device according to the second embodiment, the first to third regions 1R to 3R may be electrically isolated from each other by the protrusion patterns PD, the insulating liner layer IL, and the second blocking layers 2BC. Therefore, even though a high voltage such as a program voltage is applied to a global line GL, a leakage or bridge that may occur between adjacent wells may be reduced, with the result that a breakdown voltage may be increased.

FIGS. 7A to 7I are views illustrating a method of manufacturing a memory device according to a second embodiment of the present disclosure. In the method of manufacturing the memory device according to the second embodiment, some steps identical to those of the first embodiment will be omitted here for convenience of description.

Figure 7A:
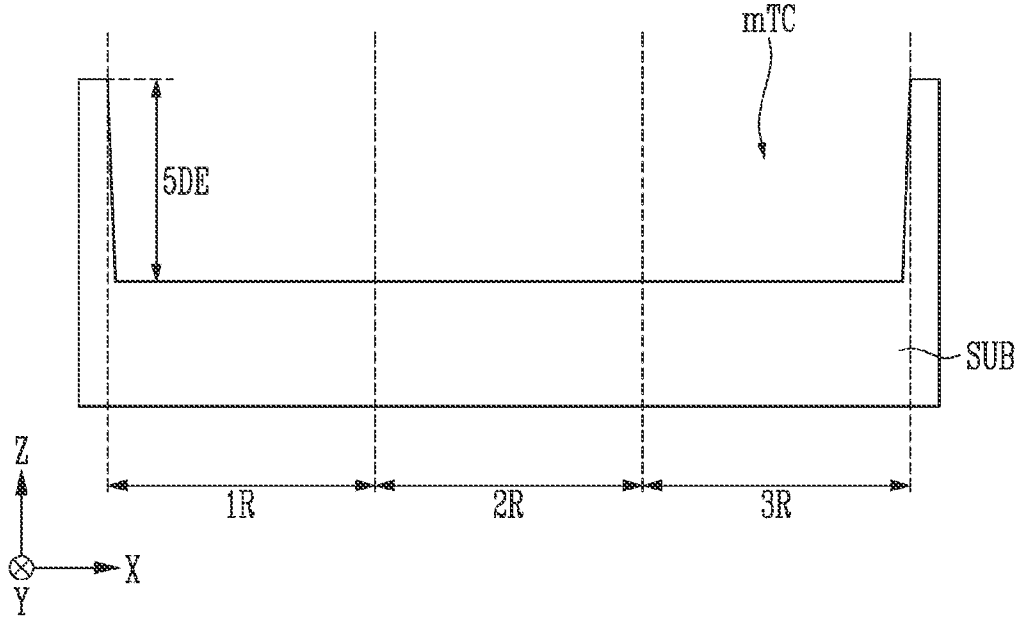
FIGS. 7A to 7I are views illustrating a method of manufacturing a memory device according to a second embodiment of the present disclosure.

Referring to FIG. 7A, a main trench mTC having a fifth depth 5DE less than the first depth (1DE of FIG. 5A) may be formed in a substrate SUB. For example, on the substrate SUB in which first to third regions 1R to 3R are defined, a mask pattern (not illustrated) for exposing all of the first to third regions 1R to 3R may be formed, and the main trench mTC may be formed by etching the substrate SUB exposed through opening of the mask pattern. The first to third regions 1R to 3R may be defined along an X direction, and the depth of the main trench mTC may be defined as the depth in a Z direction vertical to the X direction. The opening of the mask pattern may be one opening in which the first to third regions 1R to 3R extend to each other, rather than a plurality of openings for exposing the first to third regions 1R to 3R, respectively. Therefore, the main trench mTC may be formed as one trench between the first to third regions 1R to 3R.

As an etching process of forming the main trench mTC, an anisotropic dry etching process may be performed. Due to the physical characteristics of the anisotropic dry etching process, the lower width of the main trench mTC may be less than the upper width of thereof.

Figure 7B:
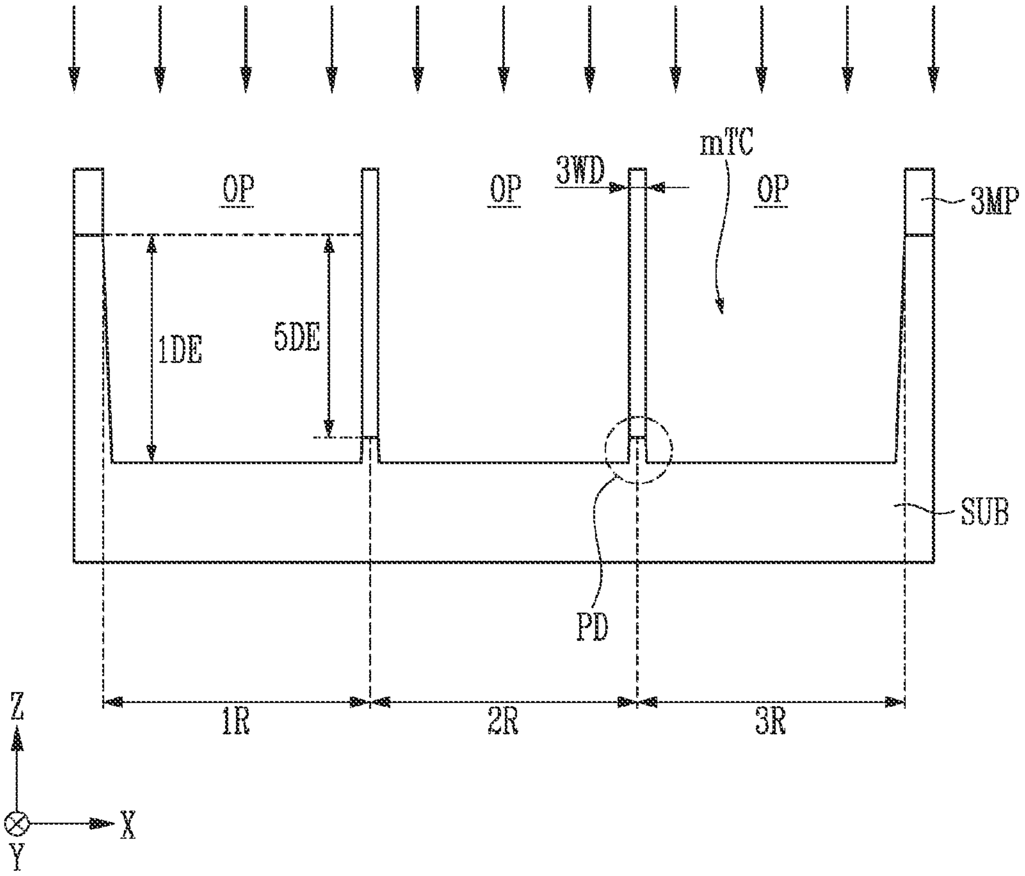

Referring to FIGS. 6 and 7B, in order to form protrusion patterns PD between the first to third regions 1R to 3R, a third mask pattern 3MP including openings OP for exposing the first to third regions 1R to 3R, respectively, may be formed on the entire structure including the main trench mTC. For example, the third mask pattern 3MP may be formed in regions in which the first to third regions 1R to 3R contact each other and the remaining region other than the first to third regions 1R to 3R. The third mask pattern 3MP formed in the regions in which the first to third regions 1R to 3R contact each other may have the third width 3WD. The third width 3WD may be determined depending on the width of the second blocking layers 2BC, illustrated in FIG. 6. For example, the third width 3WD may be the same width as the second blocking layers 2BC, which will be formed in a subsequent process, or may be a width greater than that of the second blocking layers 2BC. When the third width 3WD is the width greater than that of the second blocking layers 2BC, the third width 3WD may be a width less than a fourth width 4WD between the center of the third junction region 3JC included in the second region 2R and the center of the first junction region 1JC included in the third region 3R.

A main trench mTC having a shape of a depression/protrusion in a lower portion thereof may be formed by etching the substrate SUB exposed through the openings OP of the third mask pattern 3MP. For example, the depth of the first to third regions 1R to 3R in the main trench mTC may be a first depth 1DE, and the depth of portions between the first to third regions 1R to 3R may be the fifth depth 5DE.

Figure 7C:
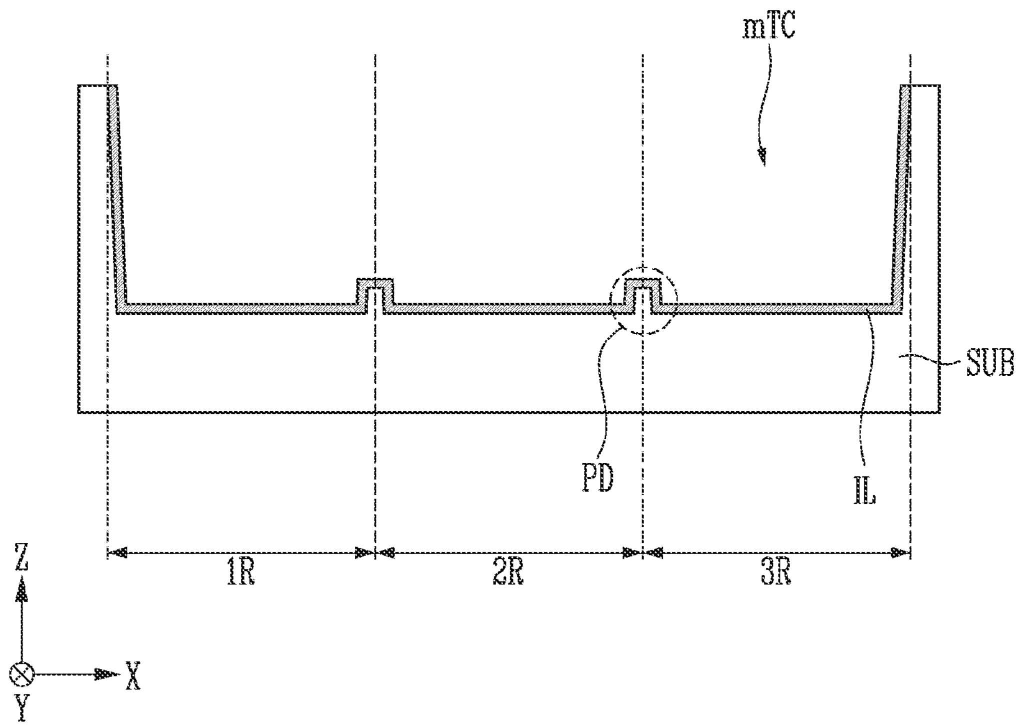

Referring to FIG. 7C, the third mask pattern (3MP of FIG. 7B) may be removed, and an insulating liner layer IL may be formed along the surface of the substrate SUB exposed through the main trench mTC. For example, the insulating liner layer IL may be formed along the surface of the substrate SUB including the protrusion patterns PD. The insulating liner layer IL may be formed of an insulating layer such as an oxide layer or a nitride layer. The insulating liner layer IL may be formed through an oxidization process of oxidizing the substrate SUB exposed through the main trench mTC. Because the insulating liner layer IL is also formed along the surfaces of the protrusion patterns PD between the first to third regions 1R to 3R, the insulating liner layer may be extended as one layer without disconnection between the first to third regions 1R to 3R.

Figure 7D:
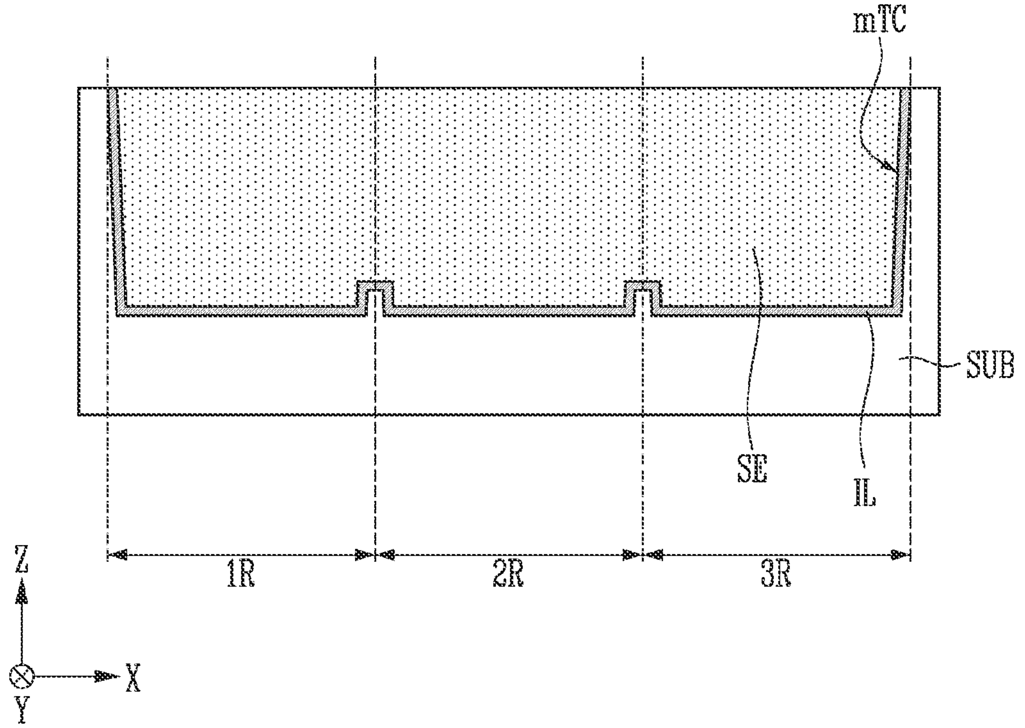

Referring to FIG. 7D, a semiconductor layer SE may be formed in the main trench mTC in which the insulating liner layer IL is formed. The semiconductor layer SE may be a polysilicon layer, and may be formed through atomic layer deposition (ALD), chemical vapor deposition (CVD) or physical vapor deposition (PVD). The semiconductor layer SE may include N-type impurities. For example, N-type impurities and the polysilicon layer may be simultaneously formed in the main trench mTC. Alternatively, after the polysilicon layer is formed, an ion implantation process of implanting N-type impurities into the polysilicon layer may be further performed. Because the semiconductor layer SE may also be formed on the substrate SUB in addition to the main trench mTC, a planarization process may be performed until the substrate SUB is exposed after the main trench mTC is filled with the semiconductor layer SE.

Figure 7E:
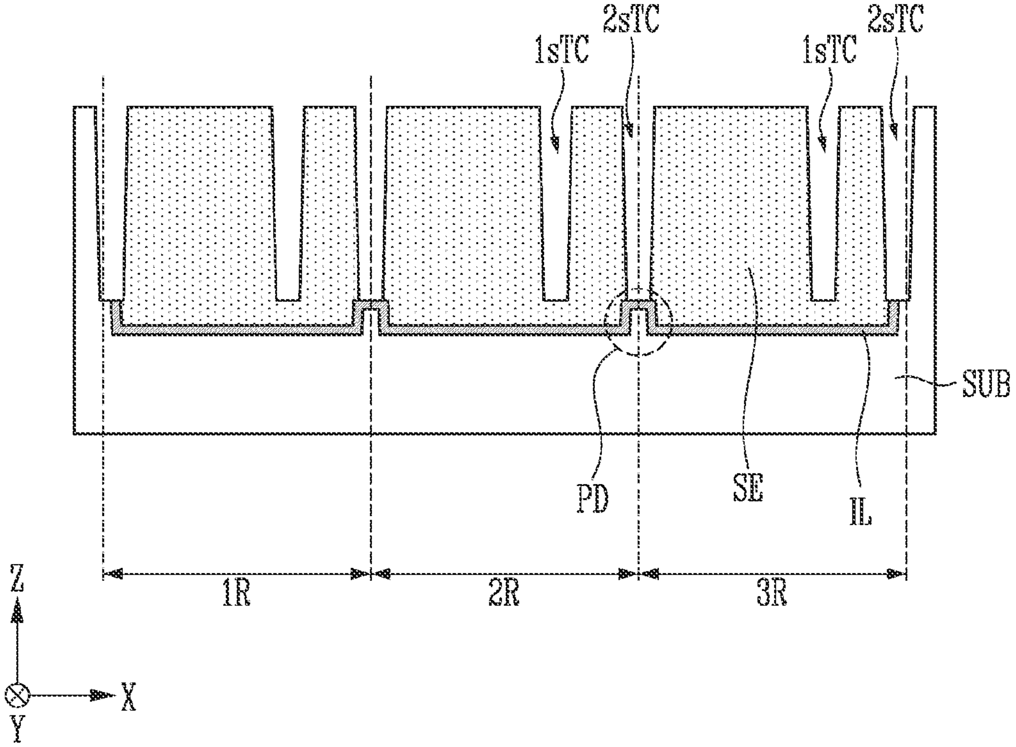

Referring to FIG. 7E, first and second sub-trenches 1*s*TC and 2*s*TC may be formed in the semiconductor layer SE. The second sub-trenches 2*s*TC may be formed in the outermost portions of the first to third regions 1R to 3R and in areas in which the first to third regions 1R to 3R are adjacent to each other, and the first sub-trenches 1*s*TC may be formed inside the first to third regions 1R to 3R, respectively. For example, in the case of the third region 3R, second sub-trenches 2*s*TC may be formed at both ends of the third region 3R, and a first sub-trench 1*s*TC may be formed between the second sub-trenches 2*s*TC.

The first and second sub-trenches 1*s*TC and 2*s*TC may be formed by etching portions of the semiconductor layer SE formed in the main trench mTC and portions of the substrate SUB enclosing the first and third regions 1R and 3R. An etching process of forming the first and second sub-trenches 1*s*TC and 2*s*TC may be performed until the insulating liner layer IL formed on the protrusion patterns PD is exposed. Therefore, the depths of the first and second sub-trenches 1*s*TC and 2*s*TC may be equal to each other.

Figure 7F:
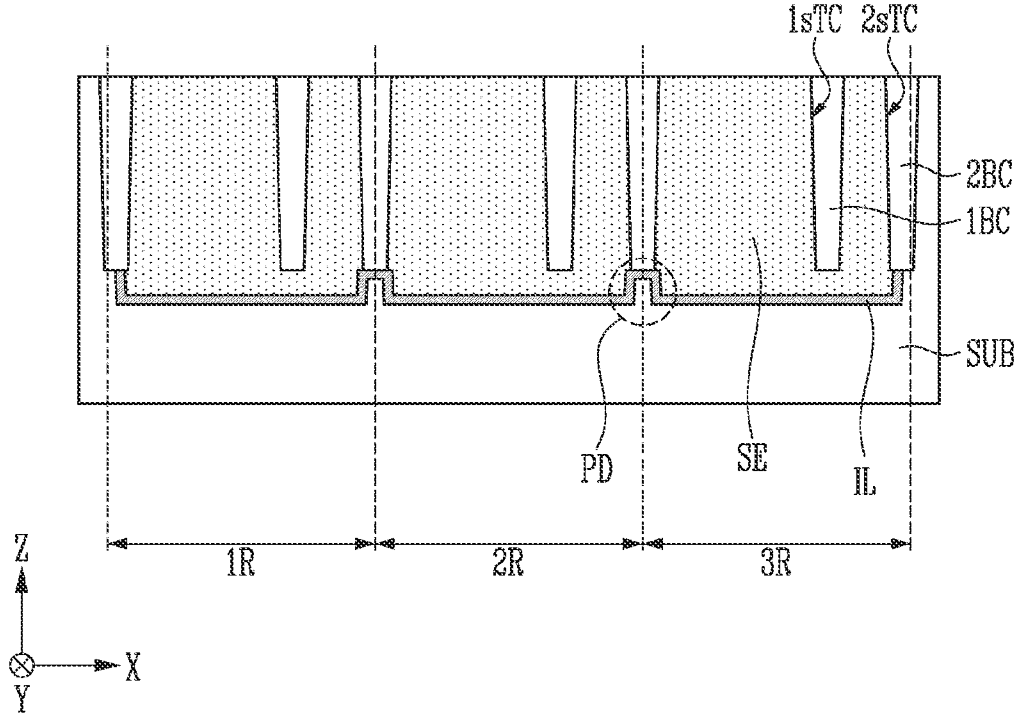

Referring to FIG. 7F, the first and second sub-trenches 1*s*TC and 2*s*TC may be filled with first and second blocking layers 1BC and 2BC, respectively. Each of the blocking layers 1BC and 2BC may be formed of an insulating layer such as an oxide layer. For example, an insulating layer for the first and second blocking layers 1BC and 2BC may be formed on the entire structure to fill the first and second sub-trenches 1*s*TC and 2*s*TC, and a planarization process may be performed until the semiconductor layer SE is exposed.

Figure 7G:
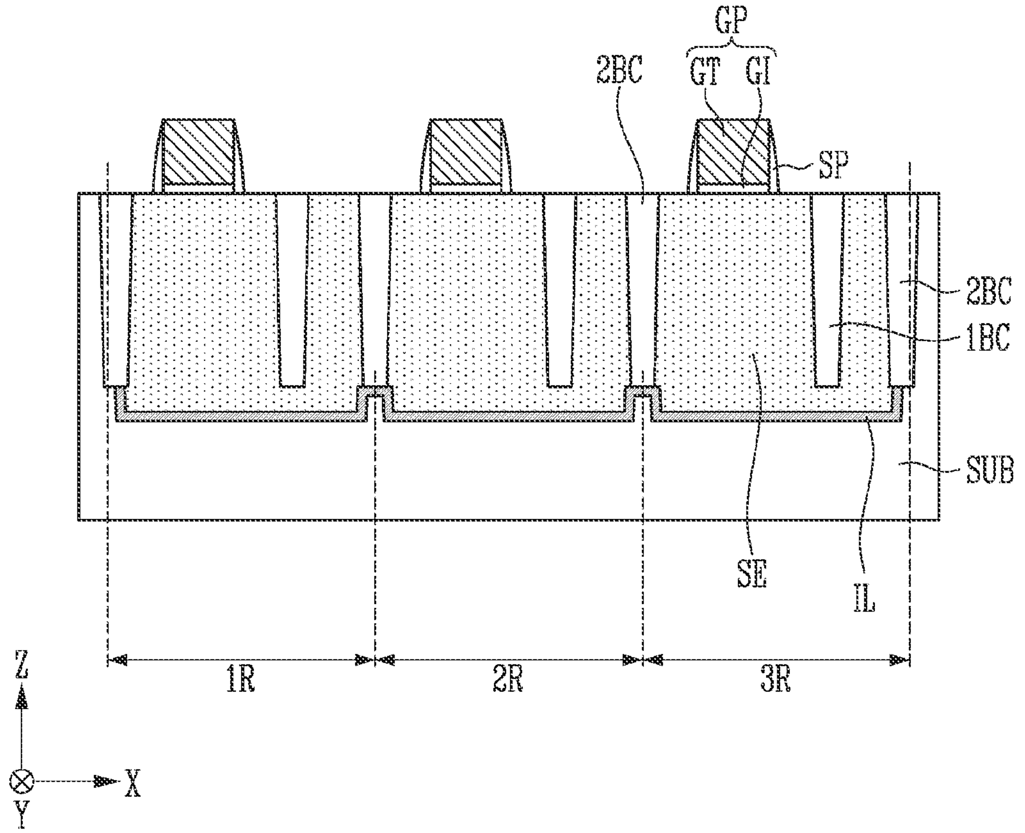

Referring to FIG. 7G, gate patterns GP may be formed on the semiconductor layer SE. Each of the gate patterns GP may include a gate insulating layer GI formed on the semiconductor layer SE and a gate conductive layer GT formed on the gate insulating layer GI. For example, an insulating layer for the gate insulating layers GI may be formed on the first and second blocking layers 1BC and 2BC, the semiconductor layer SE, the insulating liner layer IL, and the substrate SUB, and a conductive layer for the gate conductive layers GT may be formed on the insulating layer. Subsequently, the gate conductive layers GT and the gate insulating layers GI having linear shapes may be formed by patterning the conductive layer and the insulating layer. The gate patterns GP may form the block select line BLKS illustrated in FIG. 3. Therefore, although the gate patterns GP are illustrated as being separated from each other in the cross-section illustrated in FIG. 7G, the gate patterns GP may contact each other in other regions. After the gate patterns GP are formed, spacers SP may be further formed on the side surfaces of the gate patterns GP. The spacers SP may be formed of an insulating layer such as an oxide layer.

Figure 7H:
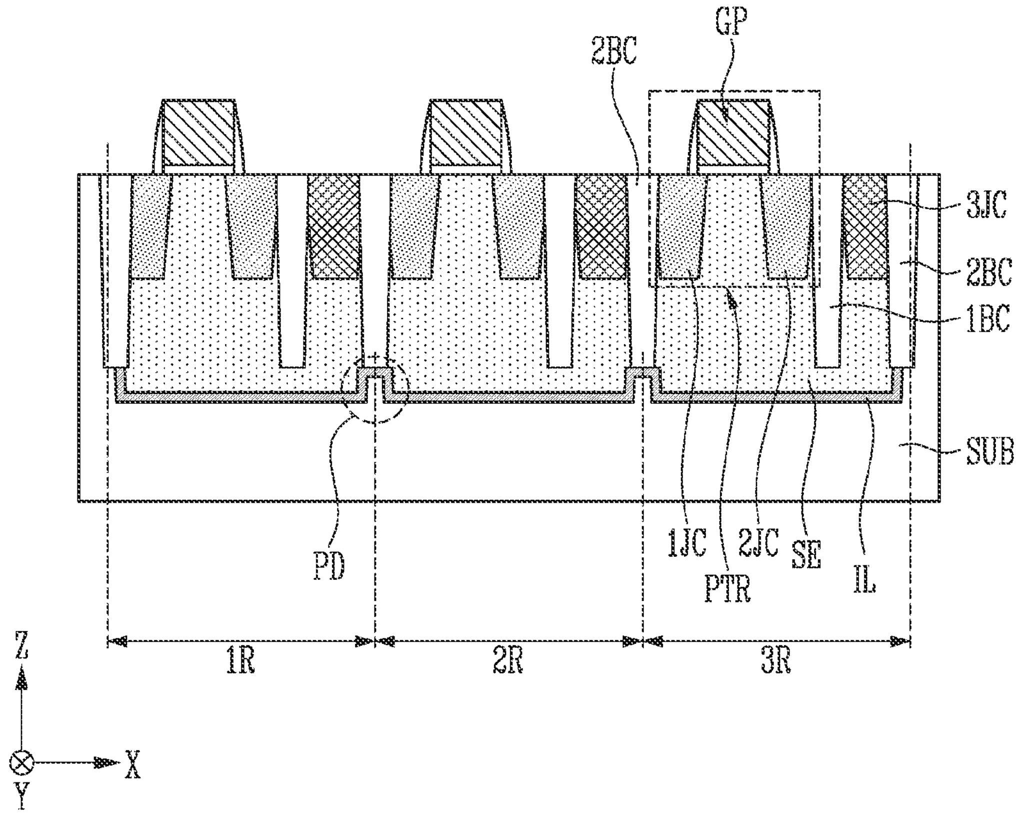

Referring to FIG. 7H, first and second junction regions 1JC and 2JC may be formed in the semiconductor layer SE contacting both ends of each of the gate patterns GP. The first and second junction regions 1JC and 2JC may be formed by implanting P-type impurities into the semiconductor layer SE. The first and second junction regions 1JC and 2JC may be formed to have a depth less than that of the first or second blocking layer 1BC or 2BC. The first and second junction regions 1JC and 2JC may be formed, and thus pass transistors PTR including first and second junction regions 1JC and 2JC and the gate patterns GP may be formed. Subsequently, a third junction region 3JC may be formed in the semiconductor layer SE between the first and second blocking layers 1BC and 2BC. The third junction region 3JC may be formed by implanting N-type impurities into the semiconductor layer SE. The third junction region 3JC may be a well-pickup. The well-pickup may be a region contacting the global line. The concentration of N-type impurities included in the third junction region 3JC may be higher than that of N-type impurities included in the semiconductor layer SE.

Figure 7I:
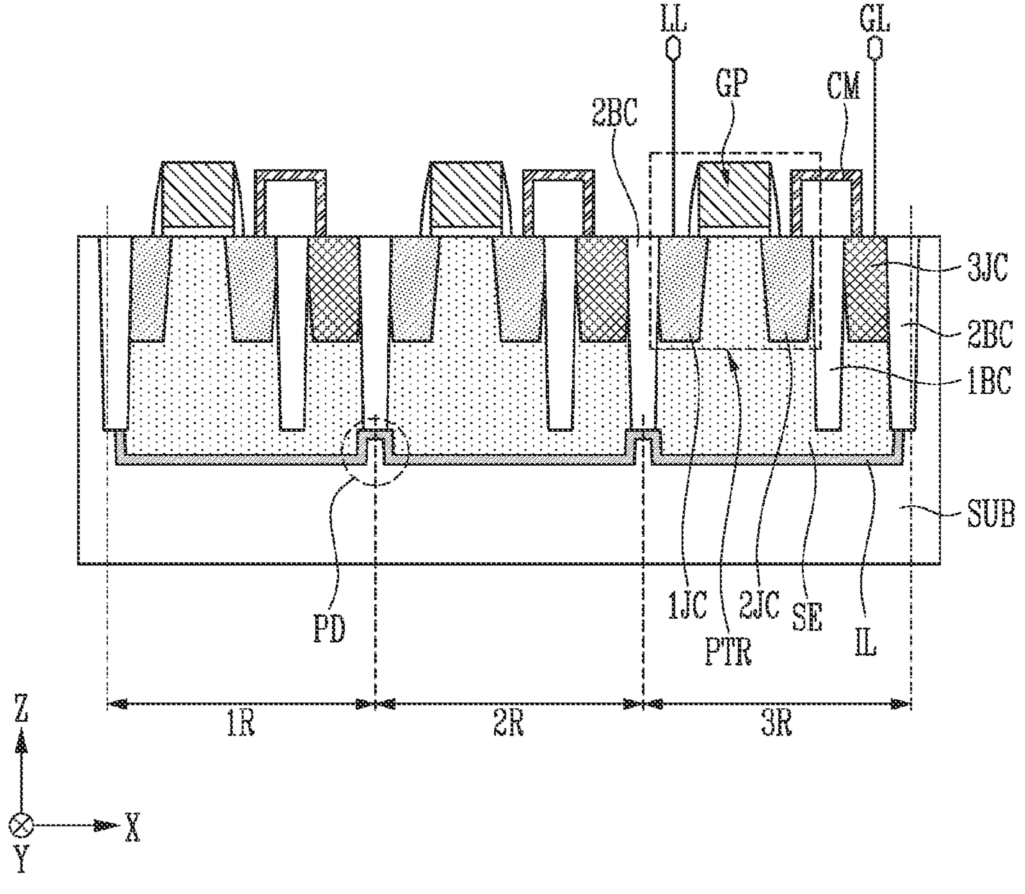

Referring to FIG. 7I, connection lines CM for electrically connecting the second and third junction regions 2JC and 3JC may be formed. The local line LL may be coupled to the first junction region 1JC, and the global line GL may be coupled to the third junction region 3JC. Although the local line LL and the global line GL are illustrated as being coupled to the third region 3R in the drawing, various local lines LL and various global lines GL may also be coupled to the first and second regions 1R and 2R.

Figure 8:
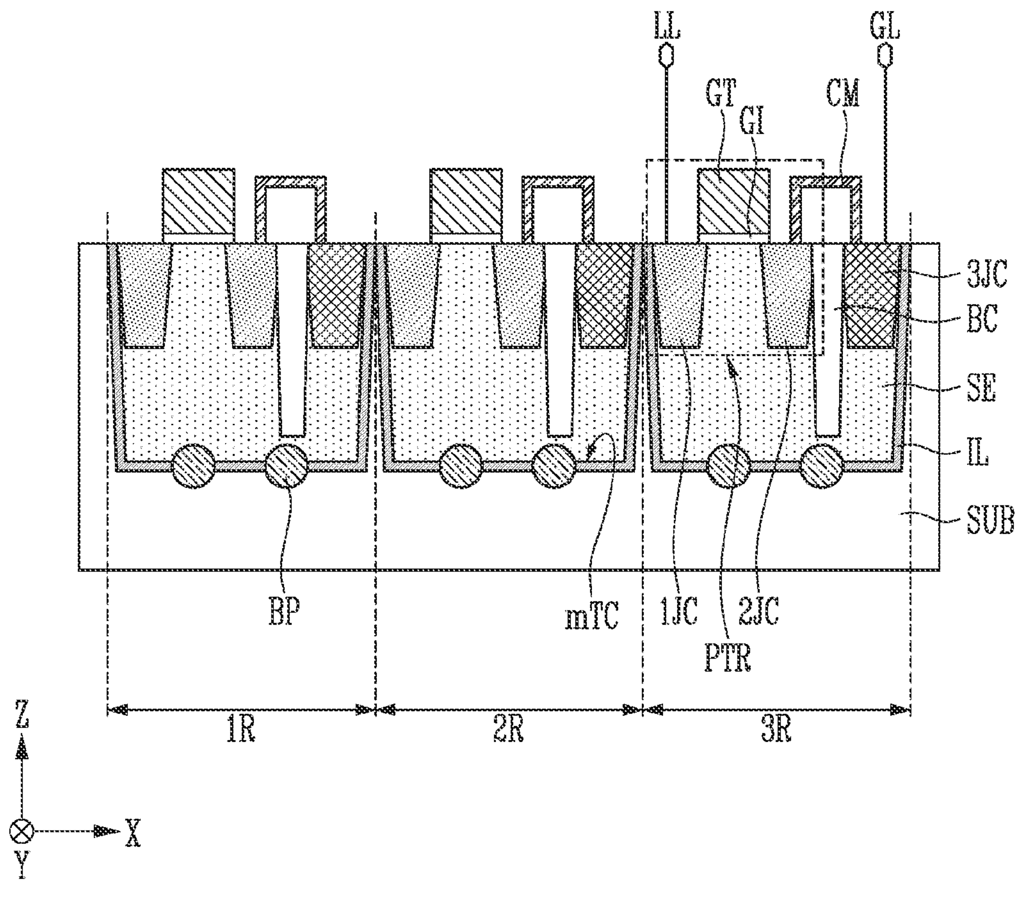
FIG. 8 is a view illustrating the structure of a memory device according to a third embodiment of the present disclosure.

FIG. 8 is a view illustrating the structure of a memory device according to a third embodiment of the present disclosure.

Referring to FIG. 8, in the memory device according to the third embodiment, blocking patterns BP may be added to the memory device according to the first embodiment. Description of the configuration identical to that of the memory device according to the first embodiment will be omitted.

The blocking patterns BP may be formed to separate an insulating liner layer IL formed in a lower portion of each of main trenches mTC from each other. For example, the blocking patterns BP may be formed to contact portions of a substrate SUB, the insulating liner layer IL, and semiconductor layers SE in the lower portions of the main trenches mTC formed in first to third regions 1R to 3R, respectively. Each of the blocking patterns BP may be formed of an oxide layer.

Although two blocking patterns BP are illustrated as being formed in each of the first to third regions 1R to 3R in FIG. 8, the number of blocking patterns BP may be set such that one or more blocking patterns BP are included in each of the regions. The blocking patterns BP may block a leakage current flowing through lower areas of the semiconductor layers SE in the first to third regions 1R to 3R.

FIGS. 9A to 9J are views illustrating a method of manufacturing a memory device according to a third embodiment of the present disclosure.

Figure 9A:
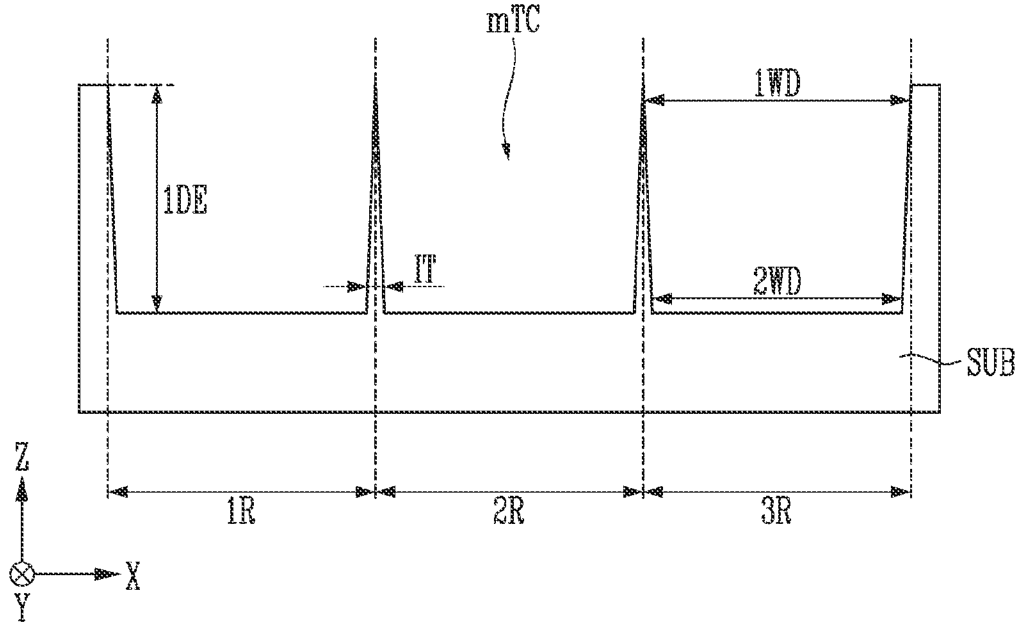
FIGS. 9A to 9J are views illustrating a method of manufacturing a memory device according to a third embodiment of the present disclosure.

Referring to FIG. 9A, main trenches mTC having a first depth 1DE may be formed in a substrate SUB. For example, on the substrate SUB in which first to third regions 1R to 3R are defined, a mask pattern (not illustrated) for exposing each of the first to third regions 1R to 3R may be formed, and the main trenches mTC may be formed by etching the substrate SUB exposed through openings of the mask pattern. The first to third regions 1R to 3R may be defined along an X direction, and the depth of the main trenches mTC may be defined as the depth in a Z direction vertical to the X direction.

As an etching process for forming the main trenches mTC, an anisotropic dry etching process may be performed. Due to the physical characteristics of the anisotropic dry etching process, the lower width of the main trench mTC formed in each of the first to third regions 1R to 3R may be less than the upper width thereof. For example, assuming that the upper width of the main trench mTC is a first width 1WD, the lower width of the main trench mTC may be a second width 2WD less than the first width 1WD. Therefore, a margin of a first interval 1T may occur between lower portions of adjacent main trenches mTC.

Figure 9B:
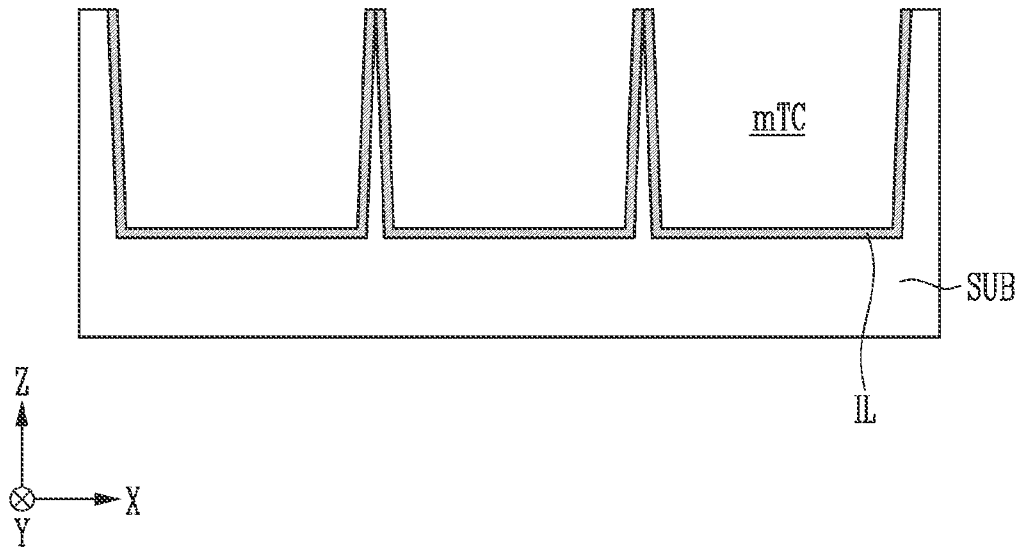

Referring to FIG. 9B, an insulating liner layer IL may be formed along the surface of the substrate SUB exposed through the main trenches mTC. The insulating liner layer IL may be formed of an insulating layer such as an oxide layer or a nitride layer. The insulating liner layer IL may be formed through an oxidization process of oxidizing the substrate SUB exposed through the main trenches mTC.

Figure 9C:
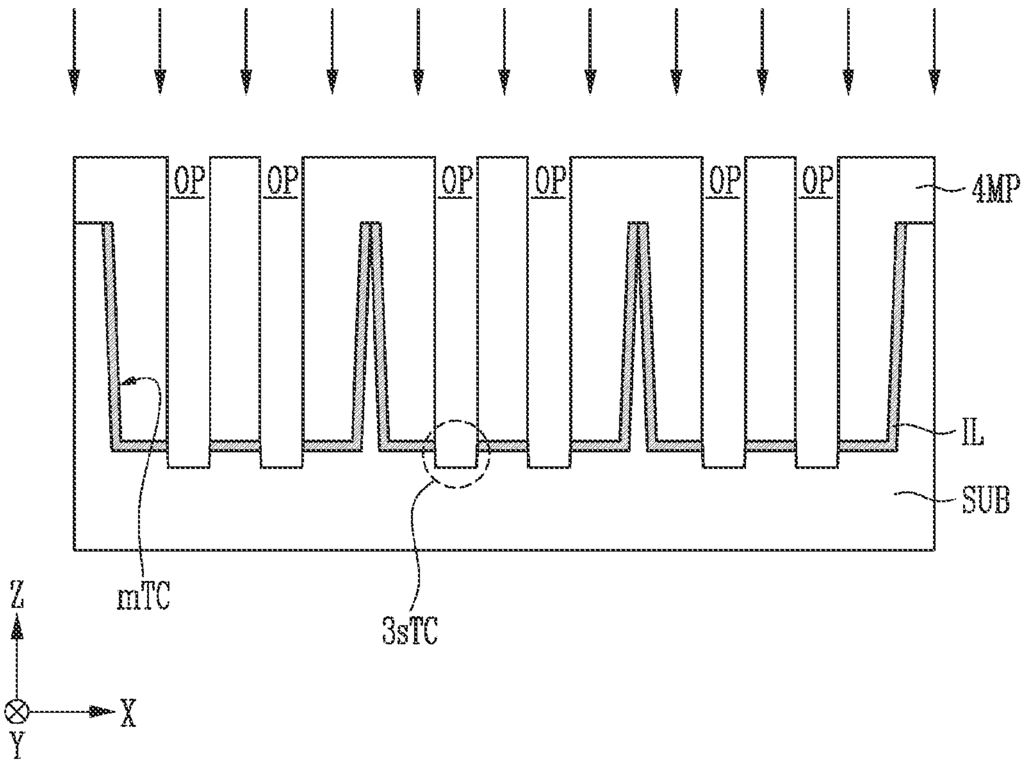

Referring to FIG. 9C, a fourth mask pattern 4MP including openings OP for exposing some lower portions of each of the main trenches mTC may be formed on the entire structure including the insulating liner layer IL. For example, the fourth mask pattern 4MP may have at least one opening OP in each of regions in which the main trenches mTC are formed. A portion of the substrate SUB may be exposed by removing the insulating liner layer IL exposed through the openings OP of the fourth mask pattern 4MP, and third sub-trenches 3*s*TC may be formed by etching exposed portions of the substrate SUB.

Figure 9D:
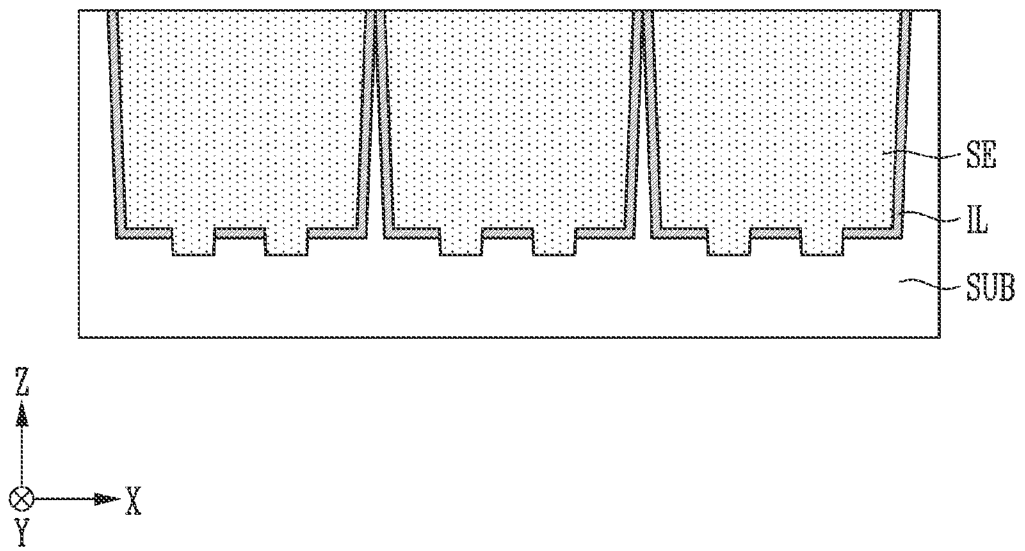

Referring to FIG. 9D, the fourth mask pattern (e.g., 4MP of FIG. 9C) may be removed, and the semiconductor layers SE may be formed in the main trenches (e.g., mTC of FIG. 9C) along which the insulating liner layer IL is formed and the third sub-trenches (e.g., 3sTC of FIG. 9C). Each semiconductor layer SE may be a polysilicon layer, and may be formed through atomic layer deposition (ALD), chemical vapor deposition (CVD), or physical vapor deposition (PVD). The semiconductor layer SE may include N-type impurities. For example, N-type impurities and the polysilicon layer may be simultaneously formed in the main trenches mTC. Alternatively, after the polysilicon layer is formed, an ion implantation process of implanting N-type impurities into the polysilicon layer may be further performed. Because the semiconductor layer SE may also be formed on the substrate SUB in addition to the main trenches mTC, a planarization process may be performed until the substrate SUB is exposed after each of the main trenches mTC is filled with the semiconductor layer SE.

Figure 9E:
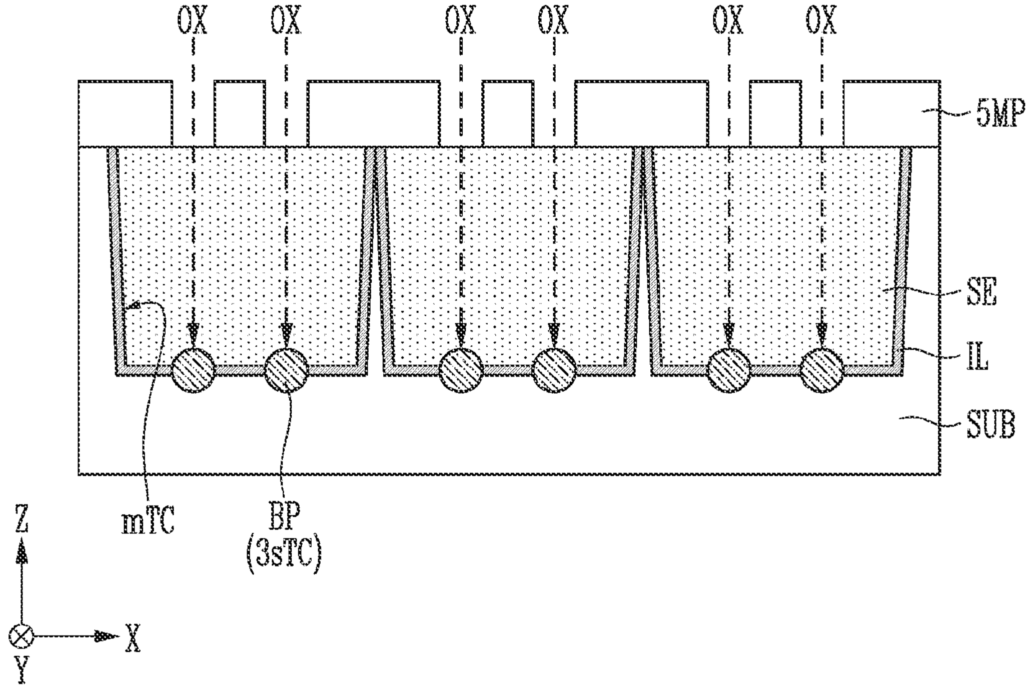

Referring to FIG. 9E, a fifth mask pattern 5MP, including openings in regions corresponding to the third sub-trenches 3sTC, may be formed on the entire structure in which the semiconductor layer SE is formed. For example, the fifth mask pattern 5MP may include openings for exposing portions of the semiconductor layer SE, and the openings may be formed in regions in which the third sub-trenches 3sTC are formed. Next, blocking patterns BP may be formed in regions in which the third sub-trenches 3sTC are formed by implanting oxygen ions OX through the openings of the fifth mask pattern 5MP. The blocking patterns BP may be formed by oxidizing the substrate SUB exposed through the third sub-trenches 3sTC. For example, when oxygen ions are implanted through the openings of the fifth mask pattern 5MP, the oxygen ions may reach the third sub-trenches 3sTC through the semiconductor layer SE. The substrate SUB may be oxidized by the oxygen ions having reached the third sub-trenches 3sTC, and an oxide layer may be grown from the oxidized substrate SUB to form the blocking patterns BP. Therefore, each of the blocking patterns BP may be formed of an oxide layer.

Figure 9F:
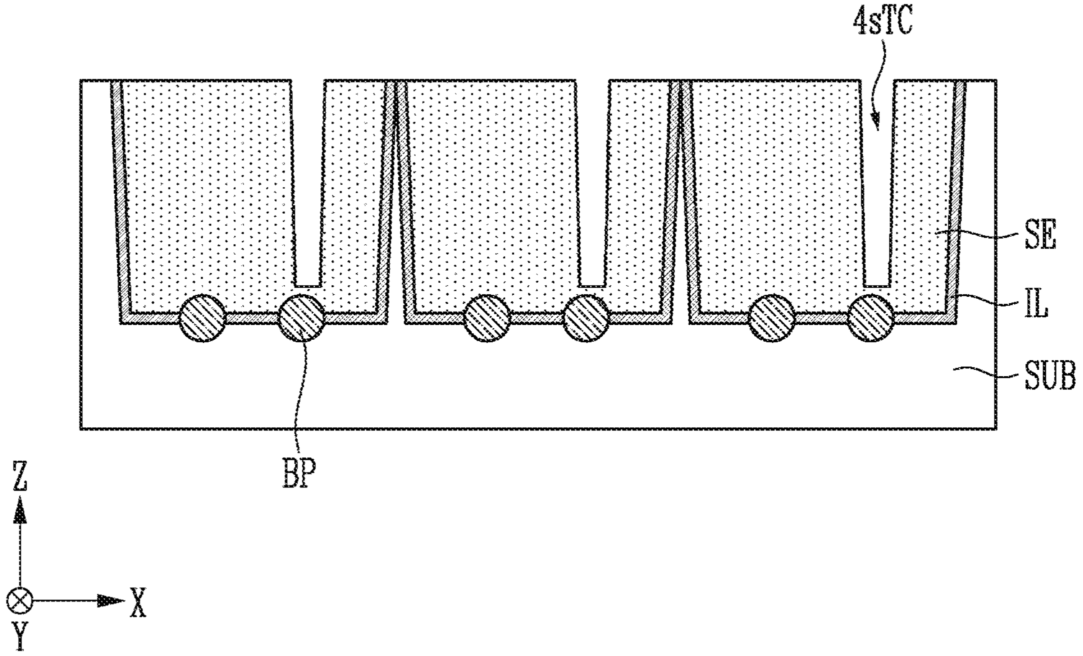

Referring to FIG. 9F, fourth sub-trenches 4*s*TC may be formed in the semiconductor layers SE. The fourth sub-trenches 4*s*TC may be formed by etching portions of the semiconductor layers SE formed in the main trenches mTC, respectively. An etching process of forming the fourth sub-trenches 4*s*TC may be stopped at a depth short of the insulating liner layer IL and the blocking patterns BP so the insulating liner layer IL and the blocking patterns BP are not exposed. For example, the fourth sub-trenches 4*s*TC may have a depth that is greater than those of the second and third junction regions (e.g., 2JC and 3JC of FIG. 8) and at which the insulating liner layer IL and the blocking patterns BP are not exposed.

Figure 9G:
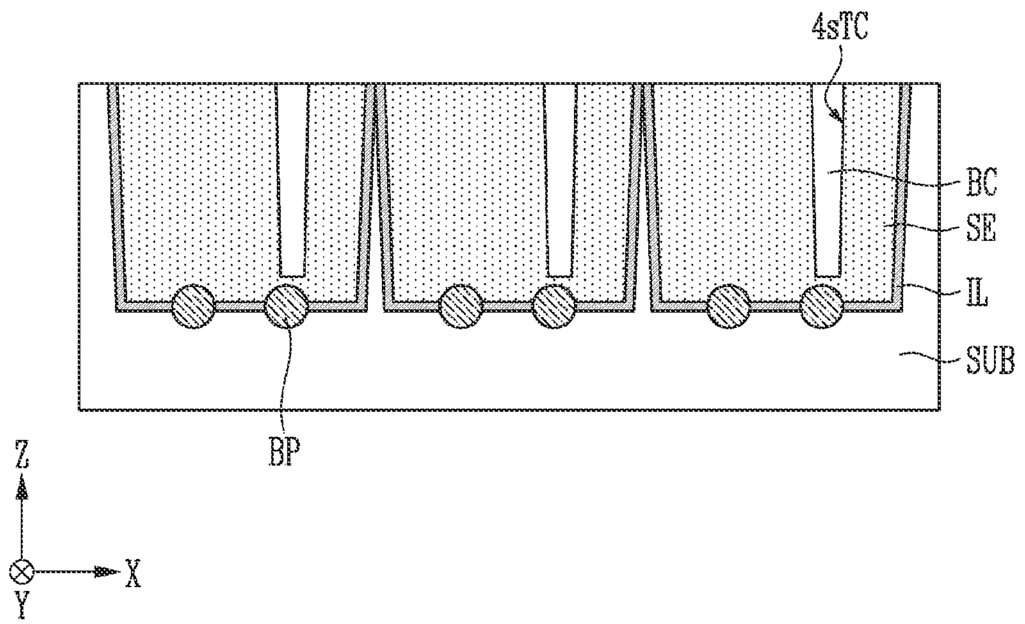

Referring to FIG. 9G, the fourth sub-trenches 4*s*TC may be filled with blocking layers BC. Each of the blocking layers BC may be formed of an insulating layer such as an oxide layer. For example, the blocking layer BC may be formed on the entire structure to fill the fourth sub-trenches 4*s*TC, and a planarization process may be performed until the semiconductor layers SE are exposed. As a result, the blocking layer BC may individually remain in different fourth sub-trenches 4*s*TC.

Figure 9H:
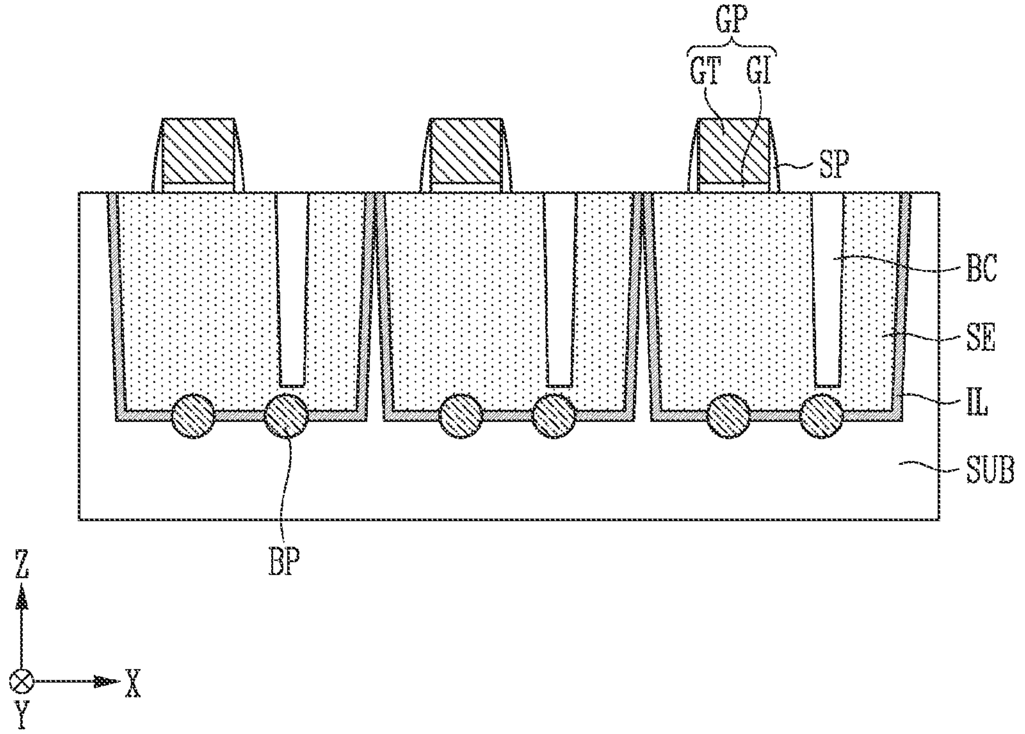

Referring to FIG. 9H, gate patterns GP may be formed on the semiconductor layers SE. Each of the gate patterns GP may include a gate insulating layer GI formed on the semiconductor layer SE and a gate conductive layer GT formed on the gate insulating layer GI. For example, an insulating layer for the gate insulating layers GI may be formed on the blocking layers BC, the semiconductor layers SE, the insulating liner layer IL, and the substrate SUB, and a conductive layer for the gate conductive layers GT may be formed on the insulating layer. Subsequently, the gate conductive layers GT and the gate insulating layers GI having linear shapes may be formed by patterning the conductive layer and the insulating layer. The gate patterns GP may form the block select line BLKS illustrated in FIG. 3. Therefore, although the gate patterns GP are illustrated as being separated from each other in the cross-section illustrated in FIG. 9H, the gate patterns GP may contact each other in other regions. After the gate patterns GP are formed, spacers SP may be further formed on the side surfaces of the gate patterns GP. The spacers SP may be formed of an insulating layer such as an oxide layer.

Figure 9I:
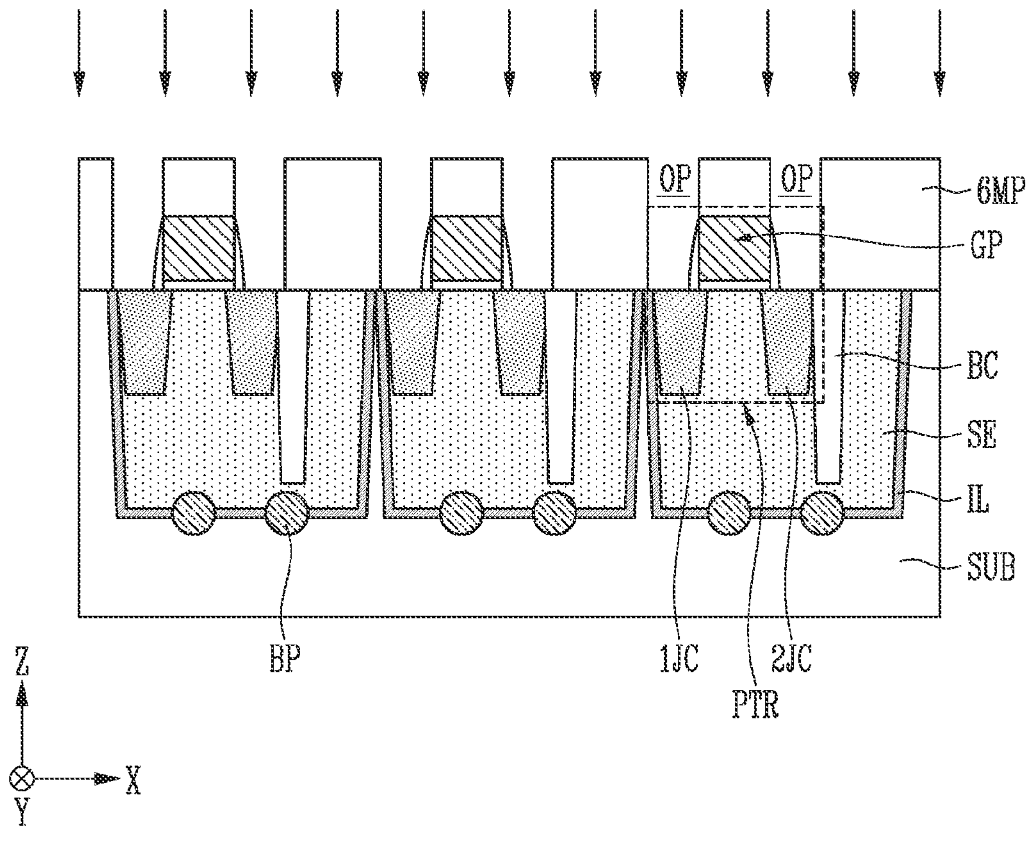

Referring to FIG. 9I, first and second junction regions 1JC and 2JC may be formed in the corresponding semiconductor layer SE contacting both ends of each of the gate patterns GP. For example, a sixth mask pattern 6MP for exposing the semiconductor layer SE contacting both ends of each of the gate patterns GP may be formed, and an ion implantation process of implanting P-type impurities into the semiconductor layer SE exposed through openings OP of the sixth mask pattern 6MP may be performed. The first and second junction regions 1JC and 2JC may be formed to have depths less than that of the blocking layer BC. The first and second junction regions 1JC and 2JC may be formed, and thus pass transistors PTR including first and second junction regions 1JC and 2JC and the gate patterns GP may be formed.

Figure 9J:
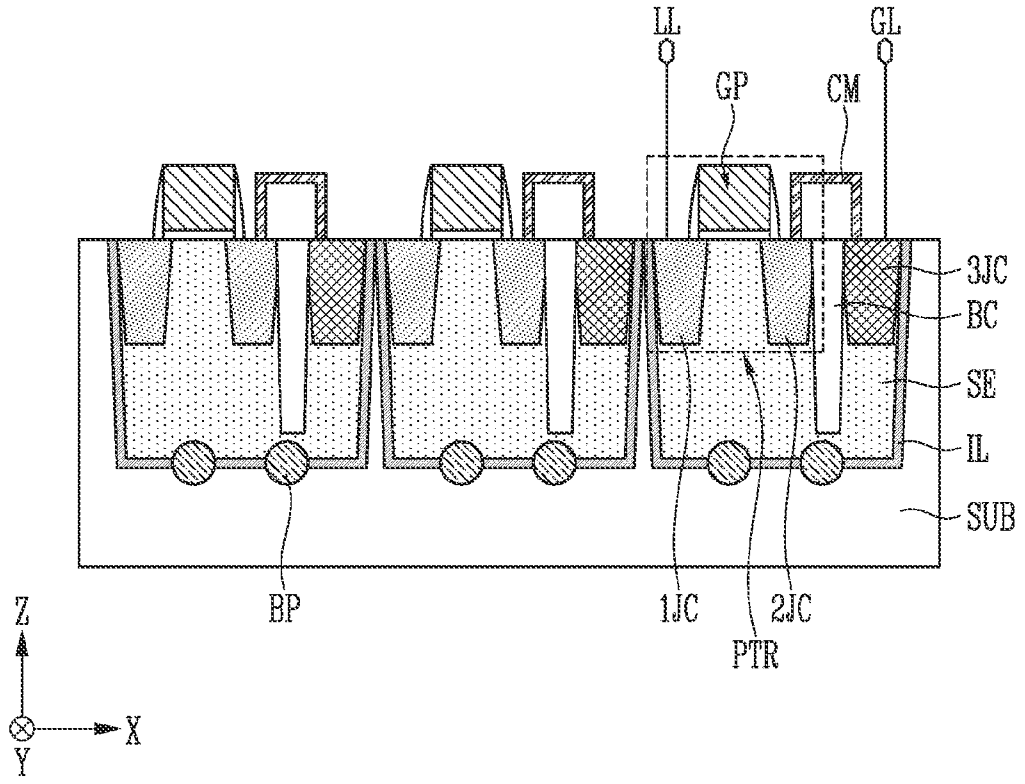

Referring to FIG. 9J, the sixth mask pattern (e.g., 6MP of FIG. 9I) may be removed, and a third junction region 3JC implanted with N-type impurities may be formed in the semiconductor layer SE between the blocking layer BC and the insulating liner layer IL. The third junction region 3JC may be a well-pickup. The well-pickup may be a region contacting the global line. Subsequently, connection lines CM for electrically connecting the second and third junction regions 2JC and 3JC may be formed. The local line LL may be coupled to the first junction region 1JC, and the global line GL may be coupled to the third junction region 3JC. Although the local line LL and the global line GL are illustrated as being coupled to the third region 3R in the drawing, various local lines LL and various global lines GL may also be coupled to the first and second regions 1R and 2R.

Figure 10:
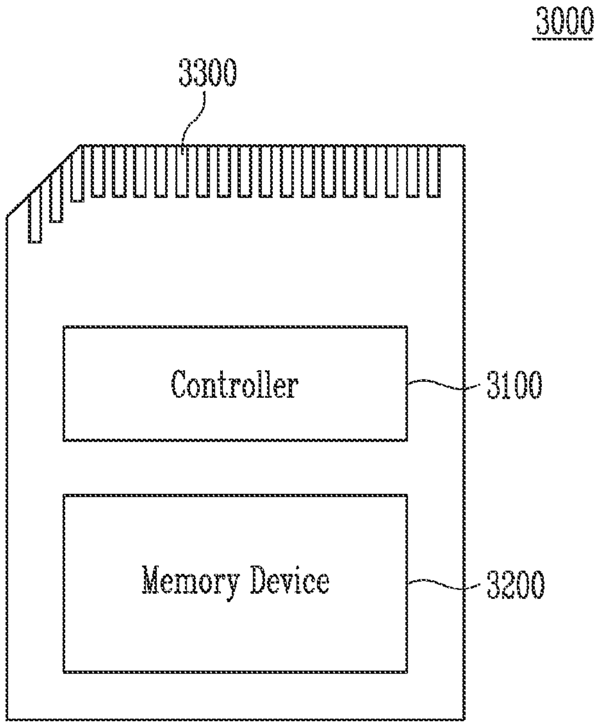
FIG. 10 is a diagram illustrating a memory card system to which a memory device according to an embodiment of the present disclosure is applied.

FIG. 10 is a diagram illustrating a memory card system to which a memory device according to an embodiment of the present disclosure is applied.

Referring to FIG. 10, a memory card system 3000 may include a controller 3100, a memory device 3200, and a connector 3300.

The controller 3100 may be coupled to the memory device 3200. The controller 3100 may access the memory device 3200. For example, the controller 3100 may control a program operation, a read operation, or an erase operation of the memory device 3200, or may control a background operation of the memory device 3200. The controller 3100 may provide an interface between the memory device 3200 and a host. The controller 3100 may run firmware for controlling the memory device 3200. In an example, the controller 3100 may include components, such as random-access memory (RAM), a processor, a host interface, a memory interface, and an error corrector.

The controller 3100 may communicate with an external device through the connector 3300. The controller 3100 may communicate with an external device (e.g., a host) based on a specific communication standard. In an embodiment, the controller 3100 may communicate with the external device through at least one of various communication standards such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe). In an embodiment, the connector 3300 may be defined by at least one of the above-described various communication standards.

The memory device 3200 may include a plurality of memory cells, and may be configured in the same manner as the memory device 100 illustrated in FIG. 1.

The controller 3100 and the memory device 3200 may be integrated into a single semiconductor device to form a memory card. For example, the controller 3100 and the memory device 3200 may be integrated into a single semiconductor device, and may then form a memory card such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 11:
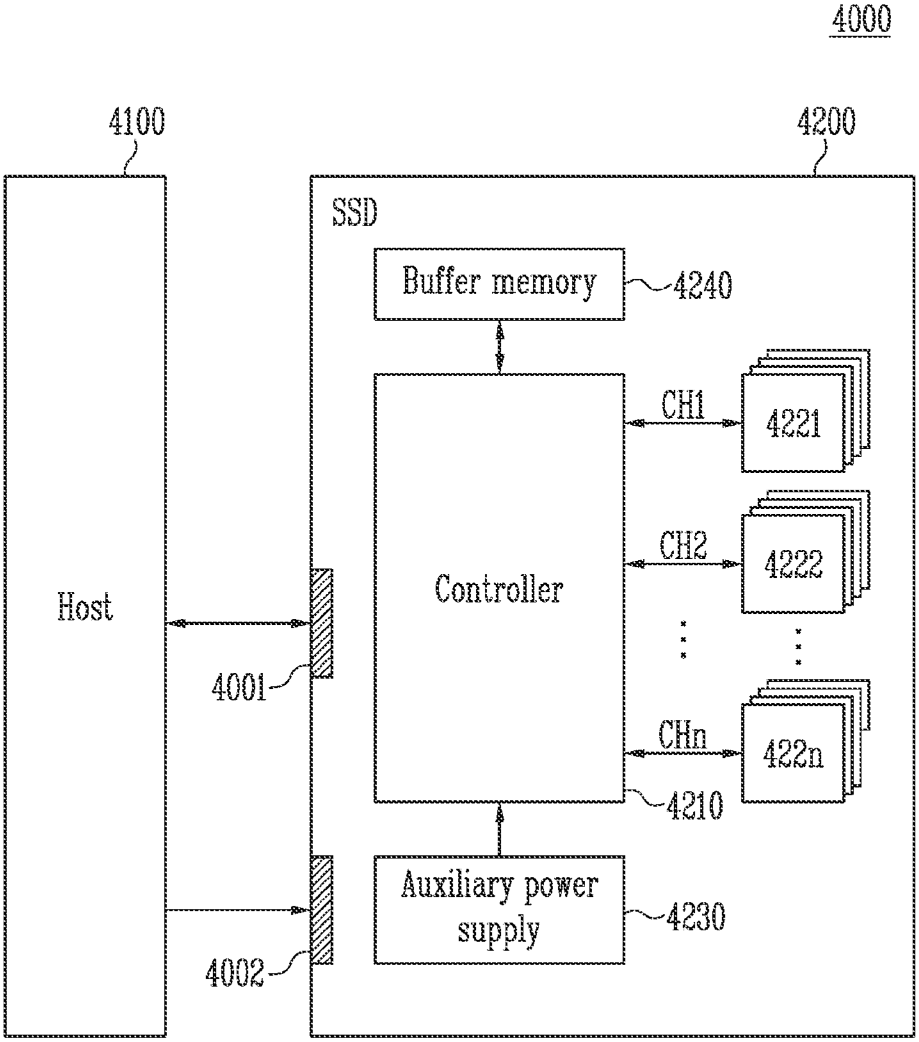
FIG. 11 is a diagram illustrating a solid-state drive (SSD) system to which a memory device according to the present disclosure is applied.

FIG. 11 is a diagram illustrating a solid-state drive (SSD) system to which a memory device according to the present disclosure is applied.

Referring to FIG. 11, an SSD system 4000 may include a host 4100 and an SSD 4200. The SSD 4200 may exchange signals with the host 4100 through a signal connector 4001, and may receive power through a power connector 4002. The SSD 4200 may include a controller 4210, a plurality of memory devices 4221 to **422*n*, an auxiliary power supply 4230, and a buffer memory 4240**.

The controller 4210 may control the plurality of memory devices 4221 to **422*n* in response to signals received from the host 4100. In an embodiment, the received signals may be signals based on the interfaces of the host 4100 and the SSD 4200**. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to **422*n* may include a plurality of memory cells configured to store data. Each of the memory devices 4221 to 422*n* may be configured in the same manner as the memory device 100 illustrated in FIG. 1. The plurality of memory devices 4221 to 422*n* may communicate with the controller 4210** through channels CH1 to CHn.

The auxiliary power supply 4230 may be coupled to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to **422*n*, or may temporarily store metadata (e.g., mapping tables) of the memory devices 4221 to 422*n*. The buffer memory 4240** may include volatile memory, such as dynamic random-access memory (DRAM), synchronous DRAM (SDRAM), double data rate (DDR) SDRAM, and low power DDR (LPDDR) SDRAM, or nonvolatile memory, such as ferroelectric RAM (FRAM), resistive RAM (ReRAM), spin transfer torque magnetic RAM (STT-MRAM), and phase-change RAM (PRAM).

The present disclosure may decrease the size of pass transistors, and may reduce interference between the pass transistors.

What is claimed is:

1. A memory device, comprising:
a well formed in a substrate;
an insulating liner layer formed between the well and the substrate, the insulating liner layer enclosing the well;
first, second, and third junction regions included in the well enclosed by the insulating liner layer, the first, second, and third junction regions being spaced apart from each other;
a gate pattern disposed on the well between the first and second junction regions; and
a blocking layer included in the well, the blocking layer disposed between the second and third junction regions,
wherein the insulating liner layer includes:
a first portion that is in contact with a first sidewall of the well; and
a second portion that is in contact with a second sidewall of the well, and
wherein the first to third junction regions are disposed between the first and second portions of the insulating liner layer.

2. The memory device according to claim 1, wherein the well is formed of a polysilicon layer including N-type impurities.

3. The memory device according to claim 1, wherein upper surfaces of the substrate and the well extend in a common plane.

4. The memory device according to claim 1, wherein the insulating liner layer is formed of at least one of an oxide layer and a nitride layer.

5. The memory device according to claim 1, wherein the first and second junction regions are regions in which P-type impurities are implanted into the well.

6. The memory device according to claim 1, wherein the third junction region is a region in which N-type impurities are implanted into the well.

7. The memory device according to claim 6, wherein a concentration of the N-type impurities implanted into the third junction region is higher than a concentration of N-type impurities included in the well.

8. The memory device according to claim 1, wherein the gate pattern comprises:

a gate insulating layer disposed on the well; and a gate conductive layer disposed on the gate insulating layer.

9. The memory device according to claim 8, wherein the gate insulating layer is formed of an oxide layer.

10. The memory device according to claim 8, wherein the gate conductive layer is formed of at least one of tungsten, molybdenum, cobalt, nickel, silicon, and polysilicon.

11. The memory device according to claim 1, wherein portions of the first and second junction regions overlap a portion of the gate pattern.

12. The memory device according to claim 1, wherein the blocking layer is formed of an oxide layer.

13. The memory device according to claim 1, wherein a lower surface of the blocking layer is spaced apart from the insulating liner layer.

14. The memory device according to claim 1, wherein the first, second, and third junction regions have depths less than that of the blocking layer.

15. The memory device according to claim 1, further comprising:

a connection line disposed on the second and third junction regions and configured to electrically connect the second and third junction regions to each other.

16. The memory device according to claim 1, further comprising:

at least one blocking pattern configured to separate the insulating liner layer disposed on a lower surface of the well.

17. The memory device according to claim 16, wherein the blocking pattern is formed of an oxide layer.

* * * * *